US009746525B2

(12) United States Patent
Kudo et al.

(10) Patent No.: US 9,746,525 B2
(45) Date of Patent: Aug. 29, 2017

(54) BATTERY SYSTEM MONITORING DEVICE

(75) Inventors: Akihiko Kudo, Hitachinaka (JP);
Mutsumi Kikuchi, Hitachinaka (JP);
Tomonori Kanai, Hitachinaka (JP);
Tatsumi Yamauchi, Hitachinaka (JP);
Akihiro Machida, Hitachinaka (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 124 days.

(21) Appl. No.: 14/241,009

(22) PCT Filed: Sep. 8, 2011

(86) PCT No.: PCT/JP2011/070498
§ 371 (c)(1),
(2), (4) Date: Feb. 25, 2014

(87) PCT Pub. No.: WO2013/035183
PCT Pub. Date: Mar. 14, 2013

(65) Prior Publication Data
US 2014/0225622 A1 Aug. 14, 2014

(51) Int. Cl.
*G01R 31/36* (2006.01)
*H02J 7/00* (2006.01)
(Continued)

(52) U.S. Cl.
CPC ........ *G01R 31/3624* (2013.01); *B60L 3/0046* (2013.01); *B60L 3/0069* (2013.01);
(Continued)

(58) Field of Classification Search
CPC .................. G01R 31/3658; H02J 7/0014
(Continued)

(56) References Cited

U.S. PATENT DOCUMENTS 6,587,800 B1 * 7/2003 Parker .............. G01R 31/31725
702/106
6,900,650 B1 * 5/2005 Sheng ................ G01R 31/2879
324/750.07
(Continued)

FOREIGN PATENT DOCUMENTS

JP 2002-374633 A 12/2002
JP 2003-149307 A 5/2003
(Continued)

*Primary Examiner* — Samuel Berhanu
*Assistant Examiner* — Tarikh Rankine
(74) *Attorney, Agent, or Firm* — Volpe and Koenig, P.C.

(57) ABSTRACT

A battery system monitoring device that monitors a battery system provided with a cell group having a plurality of battery cells connected in series with each other, including: a first control device that monitors and controls states of the plurality of battery cells of the cell group; a second control device that controls the first control device; a temperature detection unit that measures a temperature in the vicinity of the first control device; and a plurality of voltage detection lines, for measuring an inter-terminal voltage of the battery cell, which connect each of a positive electrode and a negative electrode of the battery cell and the first control device. The first control device includes a balancing switch, which performs balancing discharge of the battery cell for each of the battery cells.

11 Claims, 18 Drawing Sheets

(51) Int. Cl.
*H02J 7/16* (2006.01)
*B60L 11/18* (2006.01)
*H01M 10/48* (2006.01)
*B60L 3/00* (2006.01)
*B60L 3/04* (2006.01)
*B60L 7/14* (2006.01)
*B60L 11/14* (2006.01)
*H01M 10/42* (2006.01)

(52) U.S. Cl.
CPC *B60L 3/04* (2013.01); *B60L 7/14* (2013.01); *B60L 11/14* (2013.01); *B60L 11/187* (2013.01); *B60L 11/1816* (2013.01); *B60L 11/1859* (2013.01); *B60L 11/1861* (2013.01); *B60L 11/1866* (2013.01); *B60L 11/1877* (2013.01); *H01M 10/482* (2013.01); *H01M 10/486* (2013.01); *H02J 7/0016* (2013.01); *B60L 2200/26* (2013.01); *B60L 2210/40* (2013.01); *B60L 2240/36* (2013.01); *B60L 2240/545* (2013.01); *B60L 2240/547* (2013.01); *B60L 2240/549* (2013.01); *B60L 2240/662* (2013.01); *G01R 31/3658* (2013.01); *H01M 2010/4271* (2013.01); *H01M 2220/20* (2013.01); *Y02T 10/70* (2013.01); *Y02T 10/7005* (2013.01); *Y02T 10/7044* (2013.01); *Y02T 10/7055* (2013.01); *Y02T 10/7061* (2013.01); *Y02T 10/7066* (2013.01); *Y02T 10/7072* (2013.01); *Y02T 10/7077* (2013.01); *Y02T 10/7241* (2013.01); *Y02T 10/7291* (2013.01); *Y02T 90/127* (2013.01); *Y02T 90/14* (2013.01); *Y02T 90/16* (2013.01)

(58) Field of Classification Search
USPC .................................. 320/116, 150
See application file for complete search history.

(56) References Cited

U.S. PATENT DOCUMENTS

| | | | |
|---|---|---|---|
| 2003/0097225 A1 | 5/2003 | Teruo | |
| 2004/0018419 A1* | 1/2004 | Sugimoto | B60L 11/1851 429/61 |
| 2004/0155629 A1* | 8/2004 | Kobayashi | H02J 7/0016 320/127 |
| 2005/0088137 A1* | 4/2005 | Cohen | G06F 1/206 318/806 |
| 2006/0057447 A1* | 3/2006 | Yamase | G01R 31/3658 429/431 |
| 2006/0176022 A1* | 8/2006 | Namba | G01R 31/3651 320/130 |
| 2007/0120529 A1* | 5/2007 | Ishikawa | H02J 7/0018 320/119 |
| 2008/0074082 A1* | 3/2008 | Tae | B60L 11/1862 320/136 |
| 2008/0088279 A1* | 4/2008 | Lim | G01R 19/16542 320/134 |
| 2008/0156551 A1* | 7/2008 | Kawahara | B60L 11/1803 701/22 |
| 2009/0091332 A1* | 4/2009 | Emori | B60L 11/1855 324/537 |
| 2010/0052615 A1* | 3/2010 | Loncarevic | H02J 7/0016 320/118 |
| 2010/0225327 A1* | 9/2010 | Ishikawa | G01R 31/3658 324/434 |
| 2010/0244847 A1 | 9/2010 | Kudo et al. | |
| 2011/0199051 A1* | 8/2011 | Shimizu | H02J 7/0016 320/116 |
| 2012/0025835 A1* | 2/2012 | Chandler | G01R 19/16542 324/433 |
| 2012/0032641 A1* | 2/2012 | Yun | H02J 7/0016 320/118 |
| 2012/0038322 A1* | 2/2012 | Moorhead | B60L 11/1861 320/136 |
| 2013/0171480 A1* | 7/2013 | Englert | B60L 3/0046 429/50 |

FOREIGN PATENT DOCUMENTS

| | | |
|---|---|---|
| JP | 2005-348457 A | 12/2005 |
| JP | 2006-115640 A | 4/2006 |
| JP | 2008-067460 A | 3/2008 |
| JP | 2009-089488 A | 4/2009 |
| JP | 2010-249793 A | 11/2010 |
| JP | 2011-075504 A | 4/2011 |

* cited by examiner

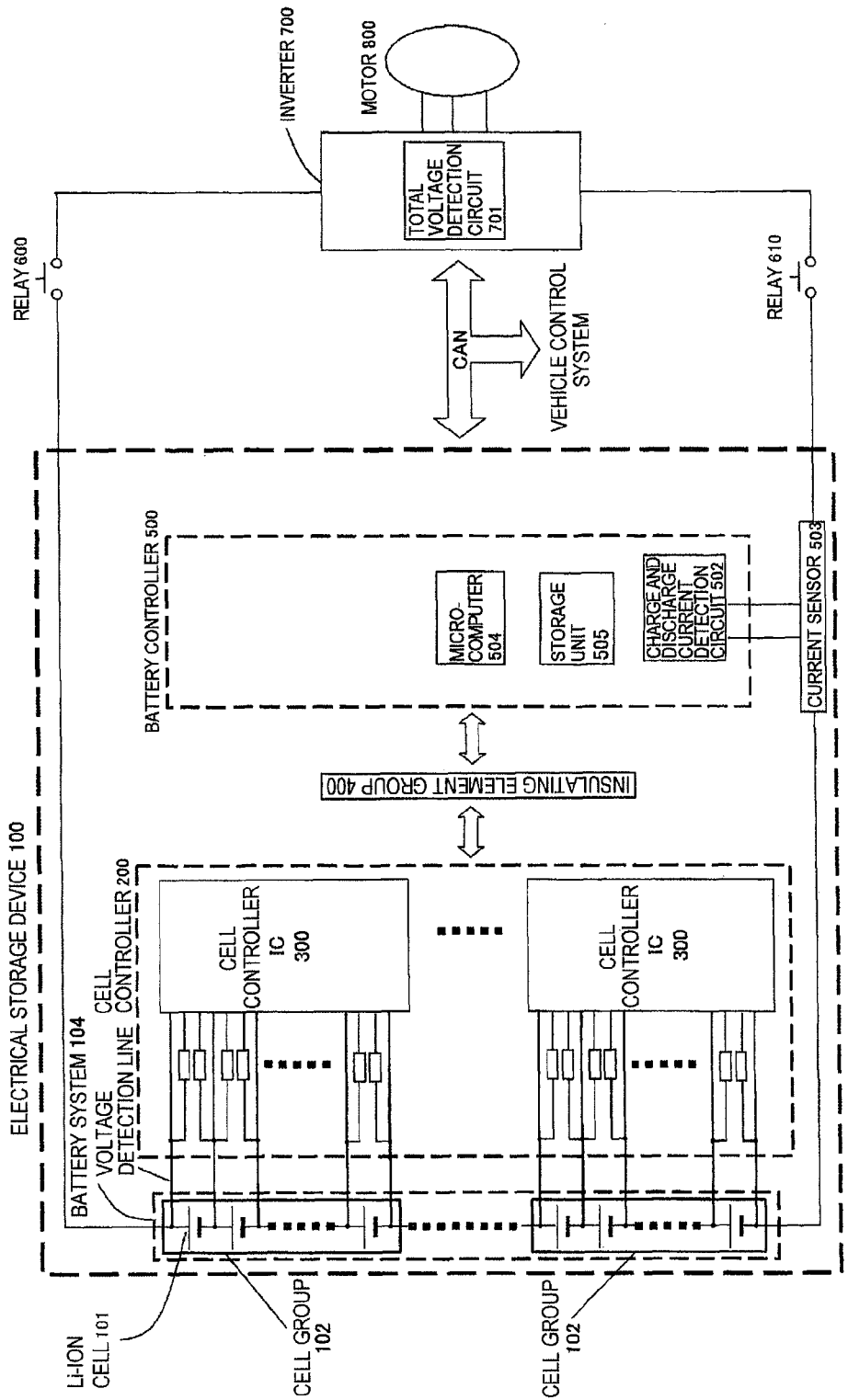
[FIG. 1]

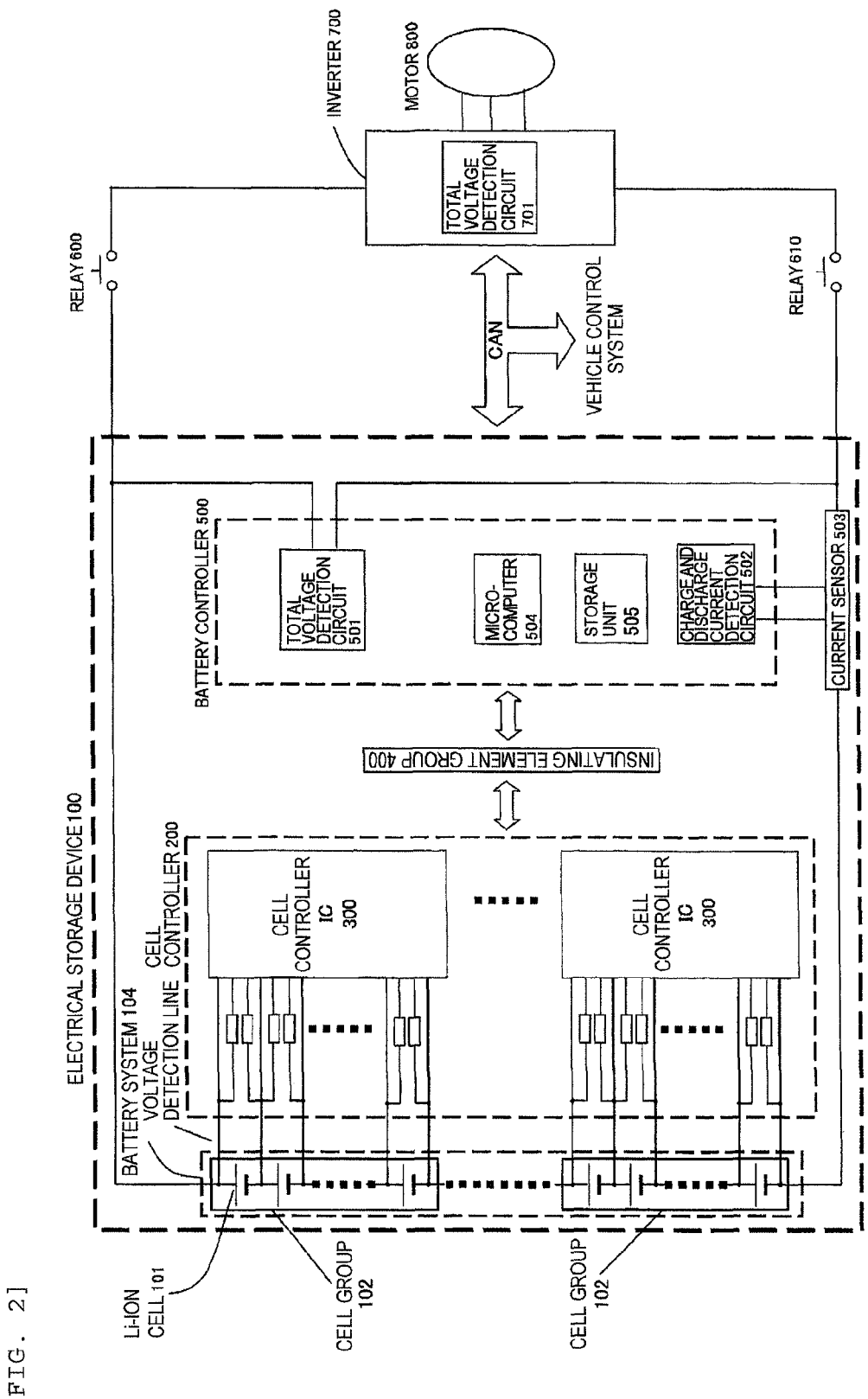
[FIG. 2]

[FIG. 3]
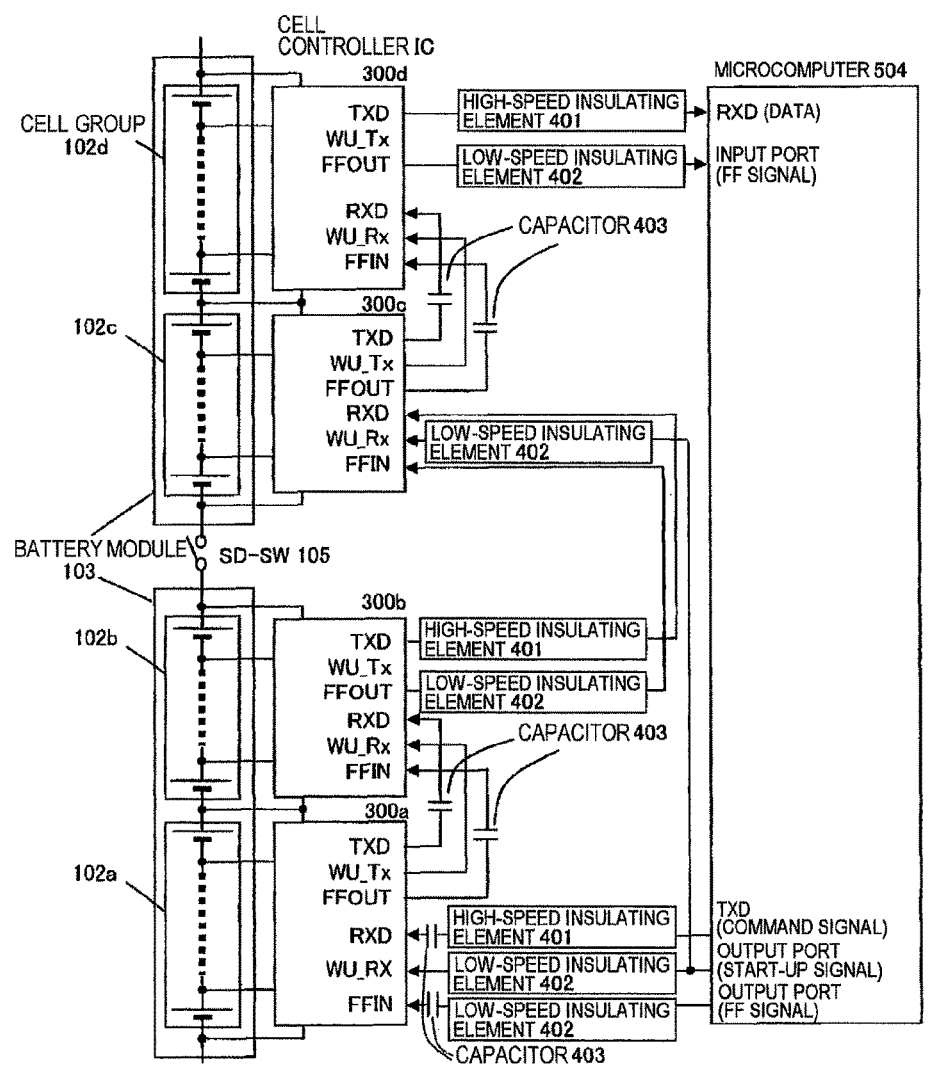

[FIG. 4]
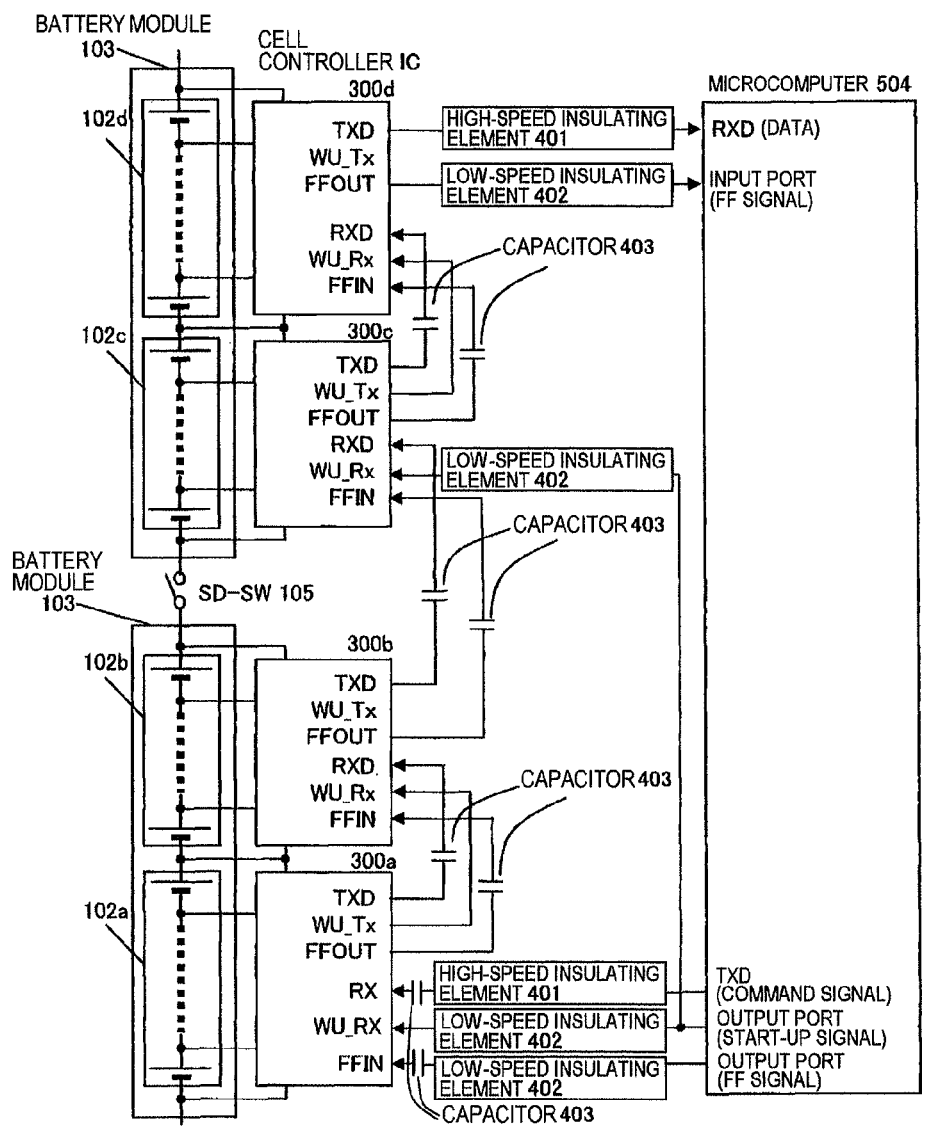

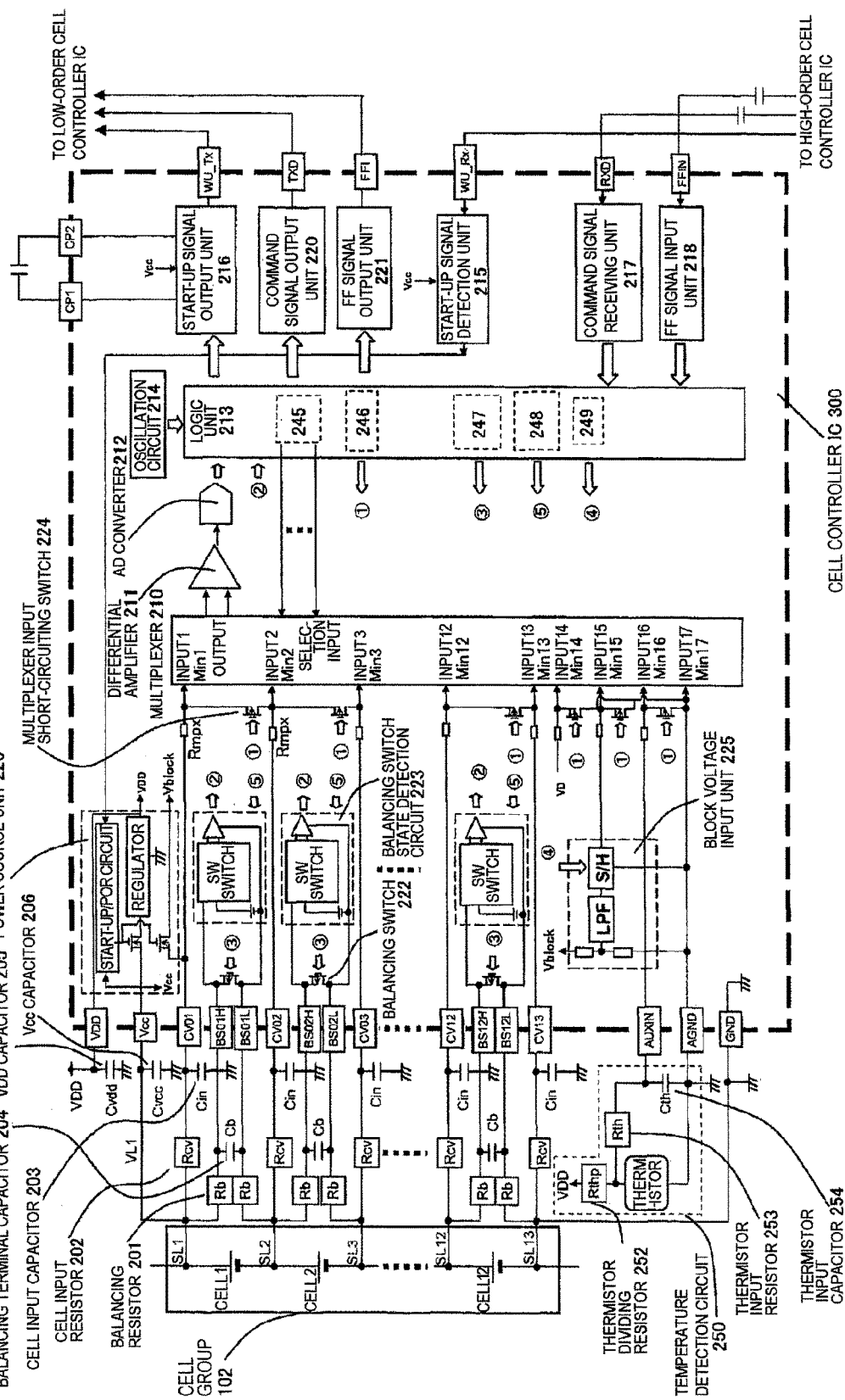
[FIG. 5]

[FIG. 6]
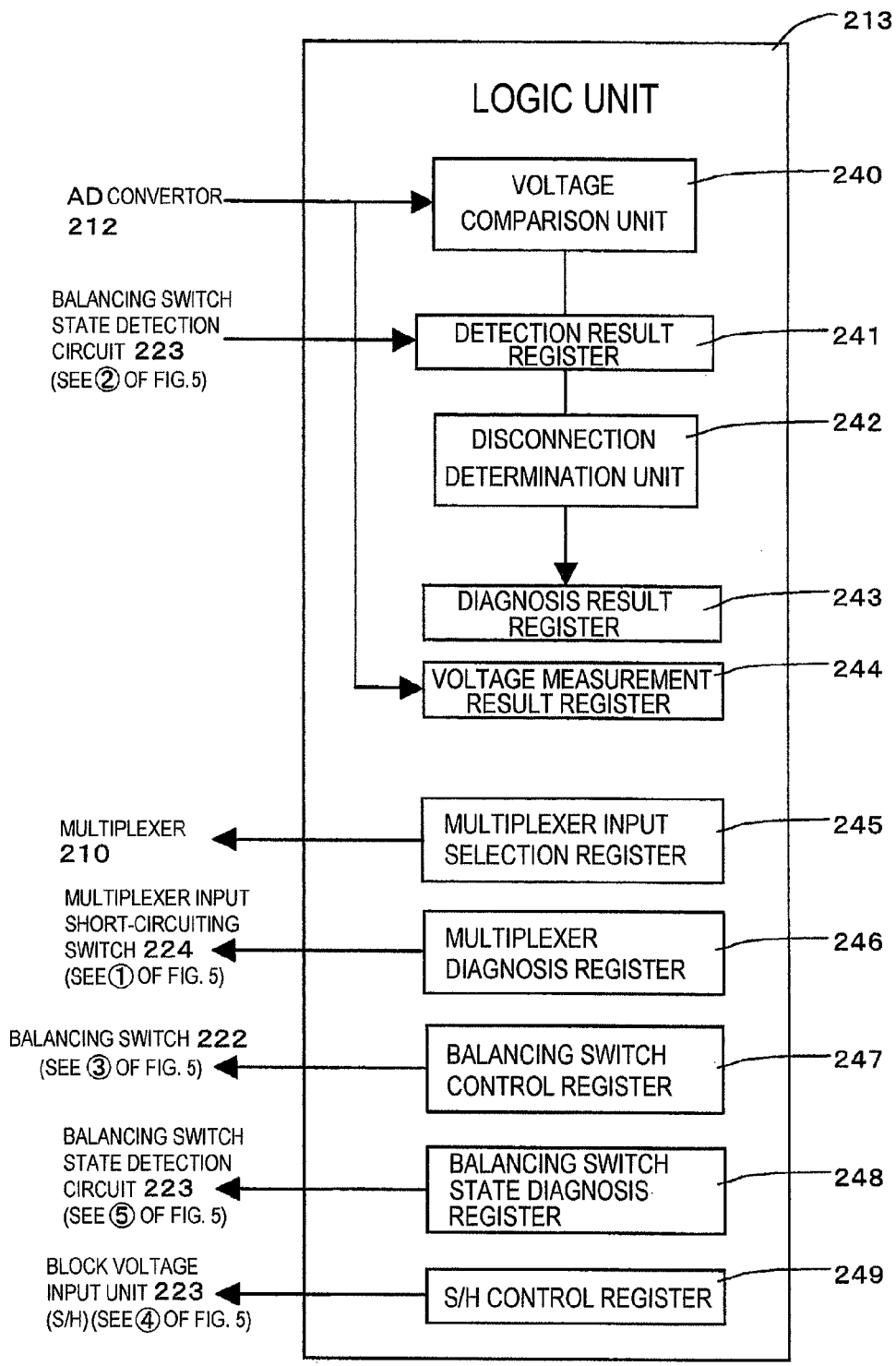

[FIG. 7]

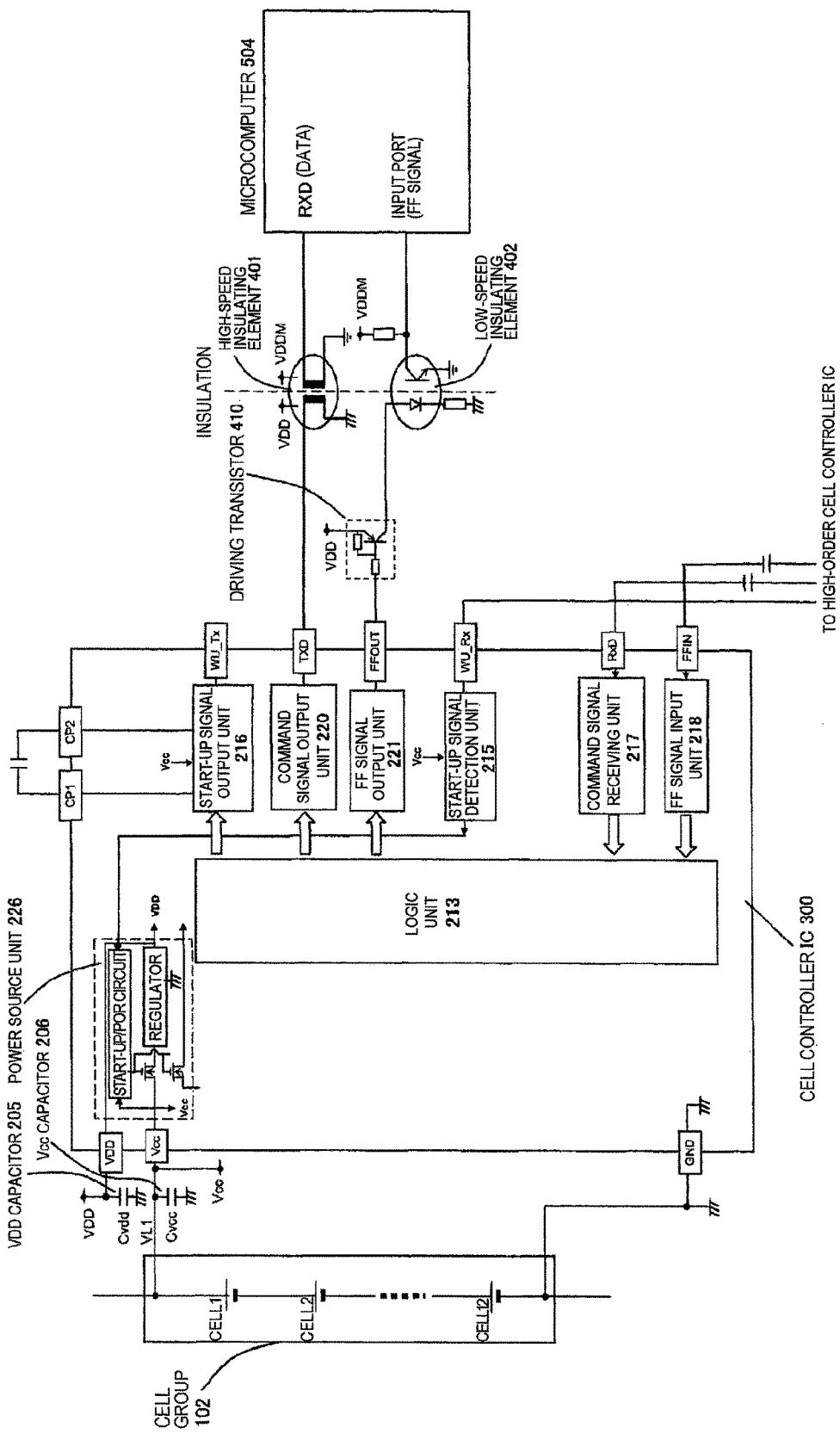
[FIG. 8]

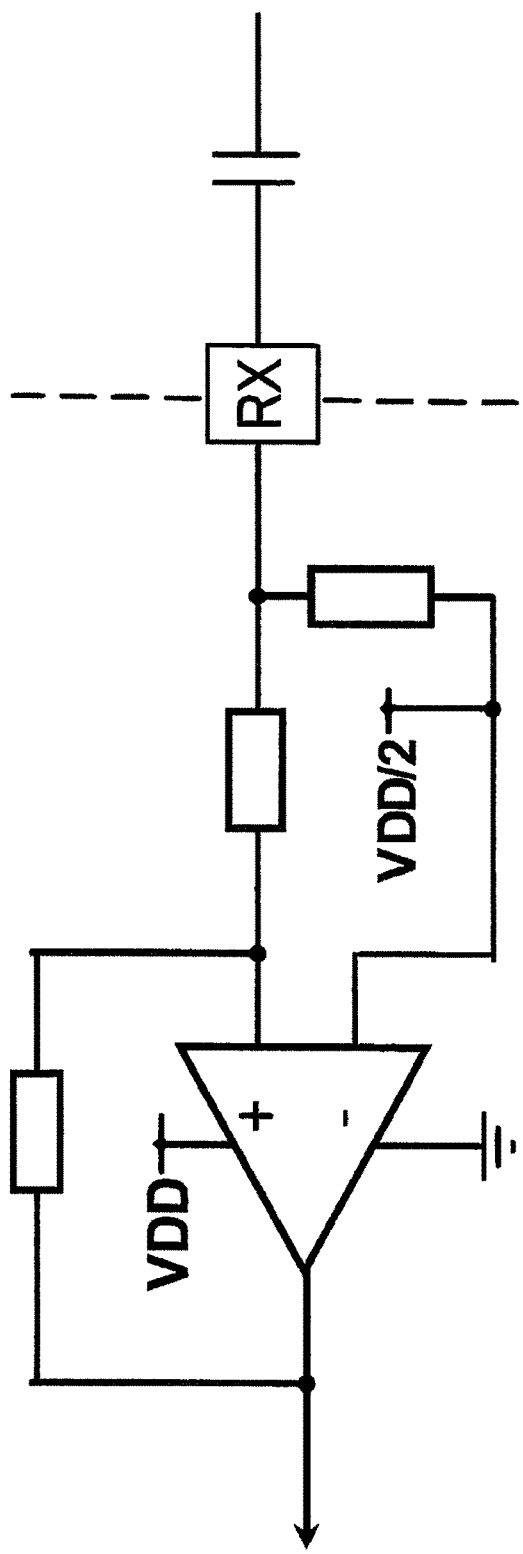
[FIG. 9]

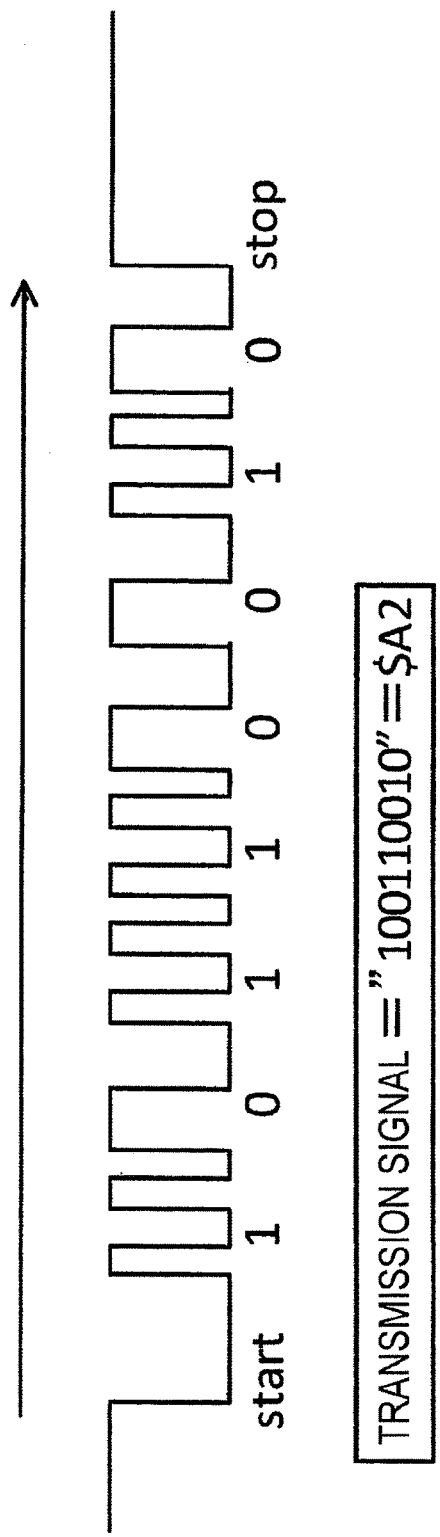
[FIG. 10]

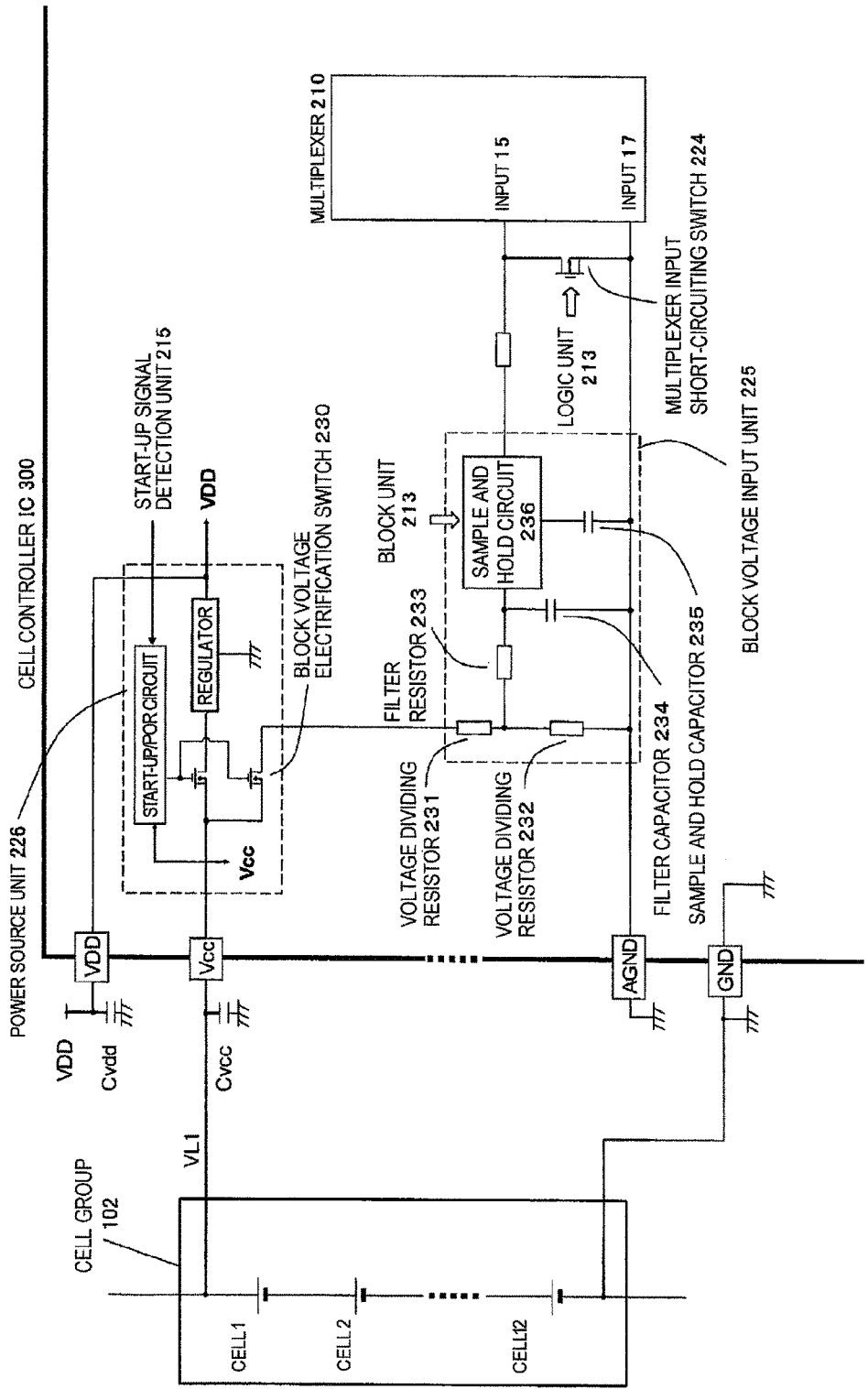
[FIG. 11]

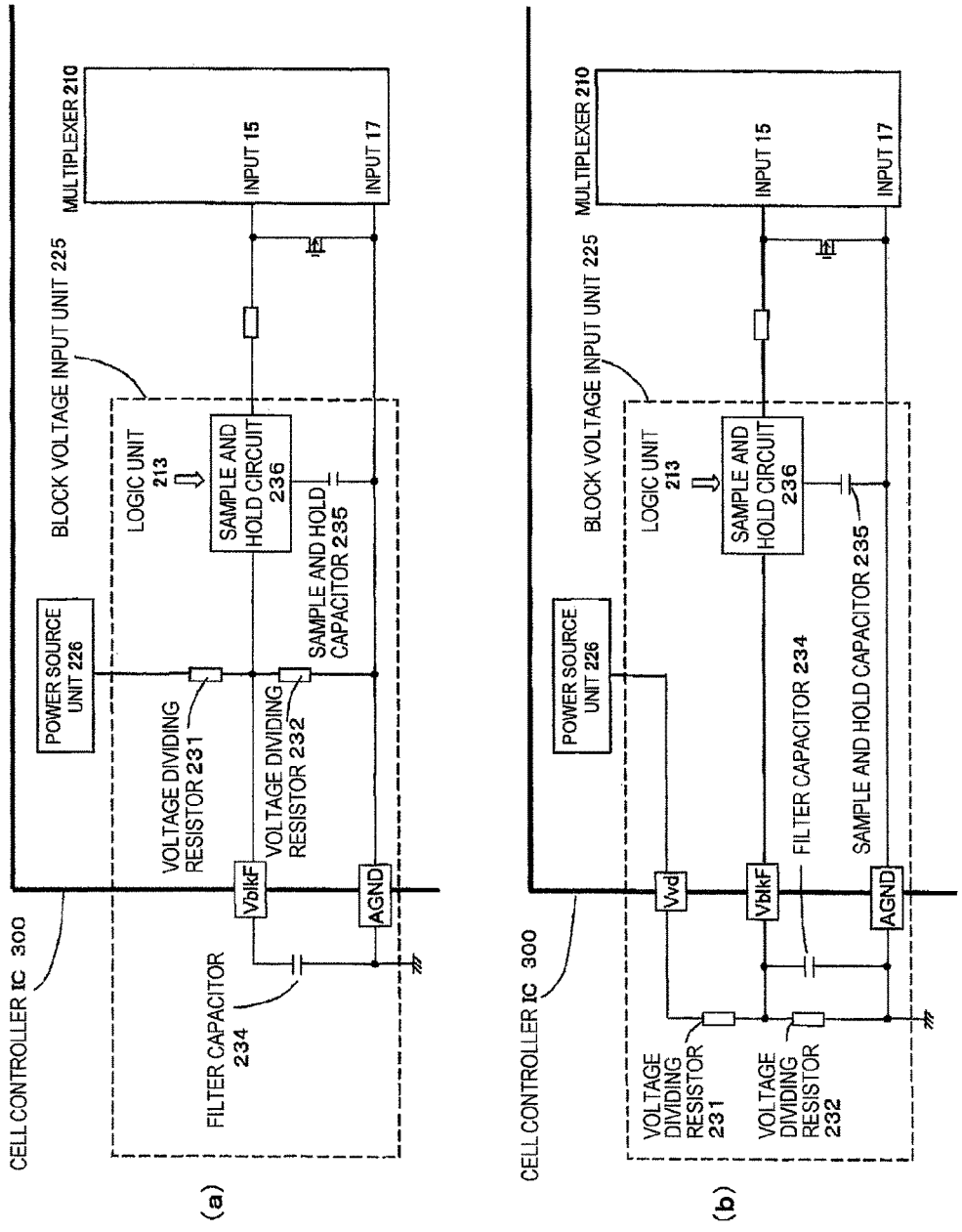
[FIG. 12]

[FIG. 13]
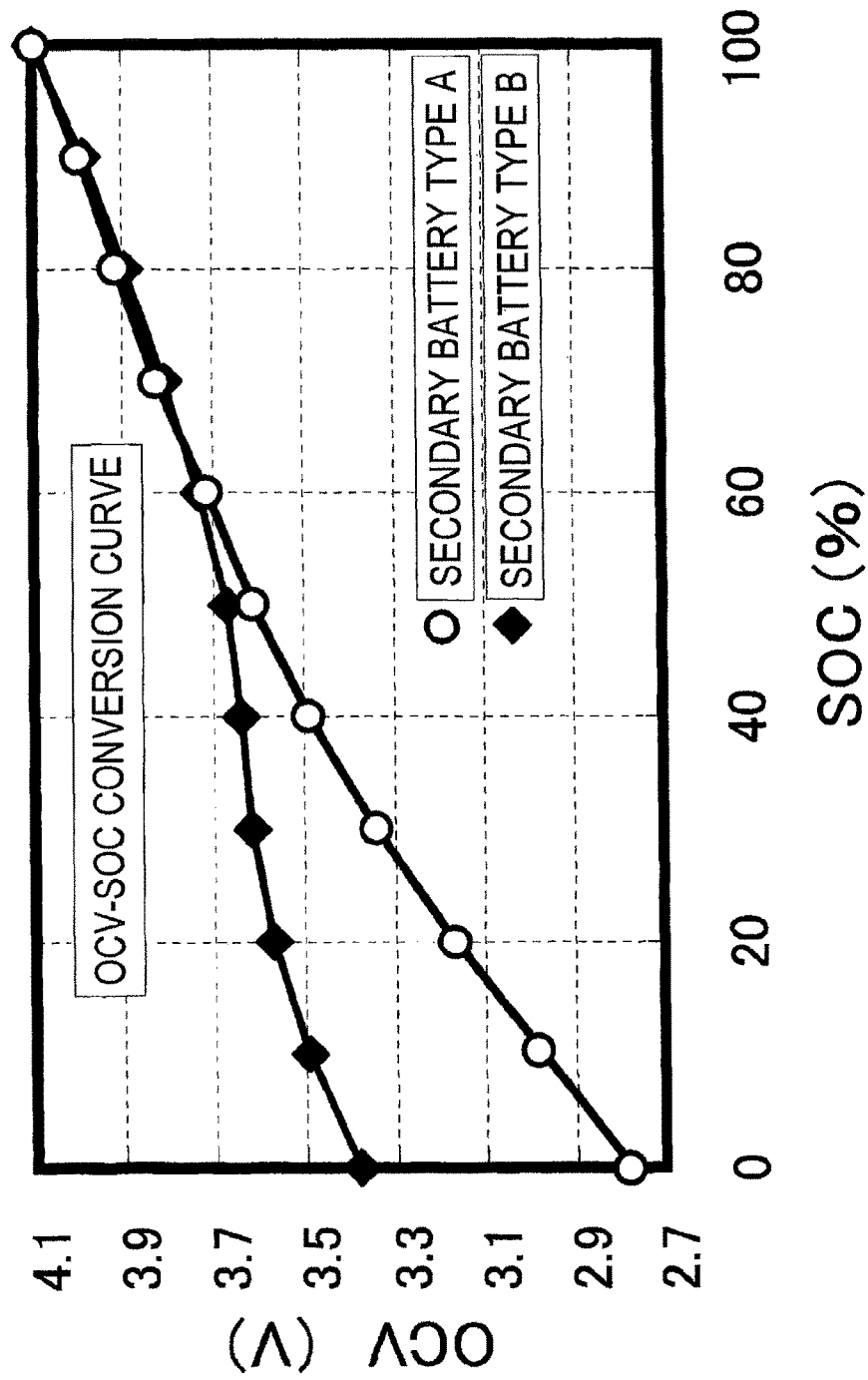

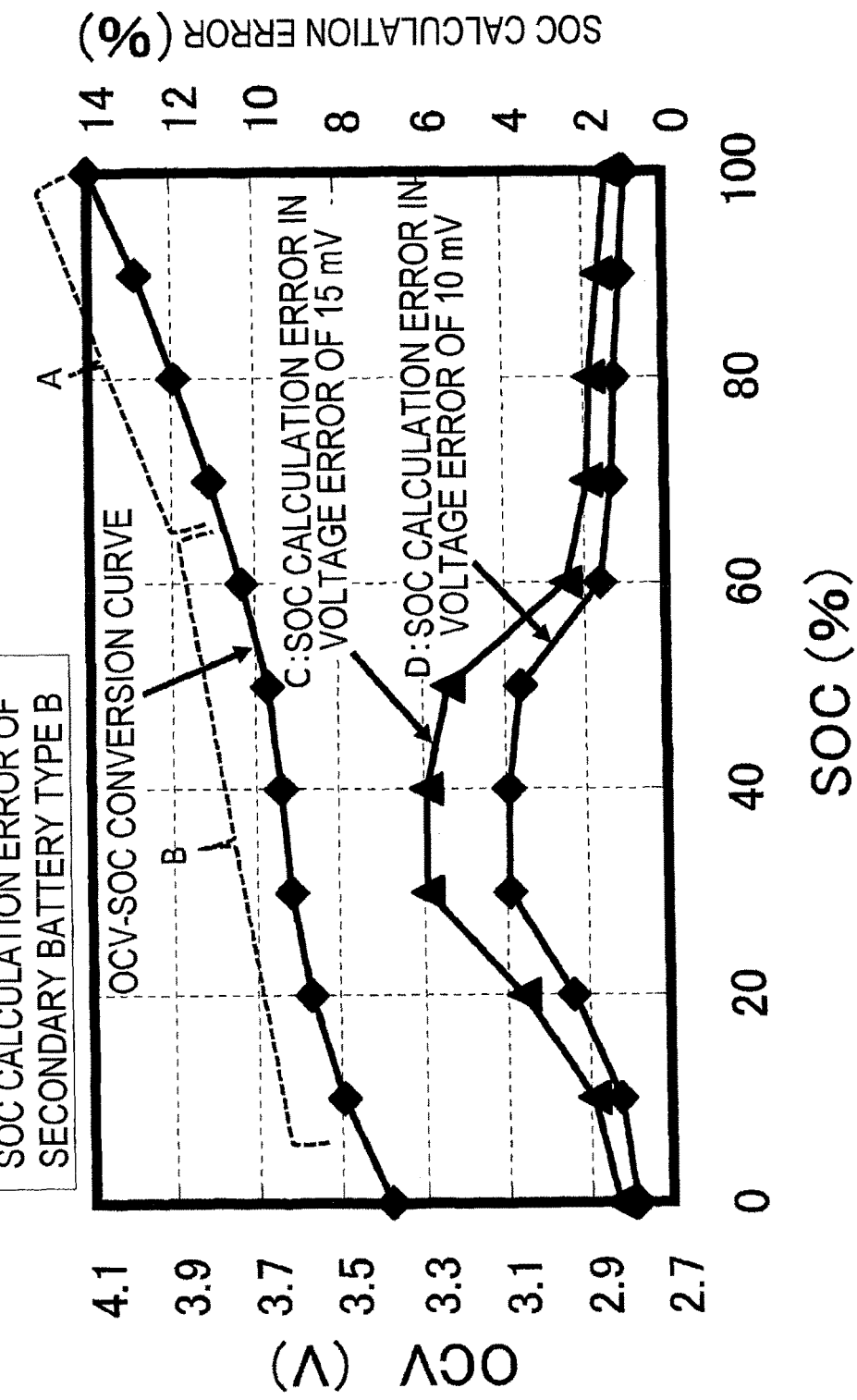
[FIG. 14]

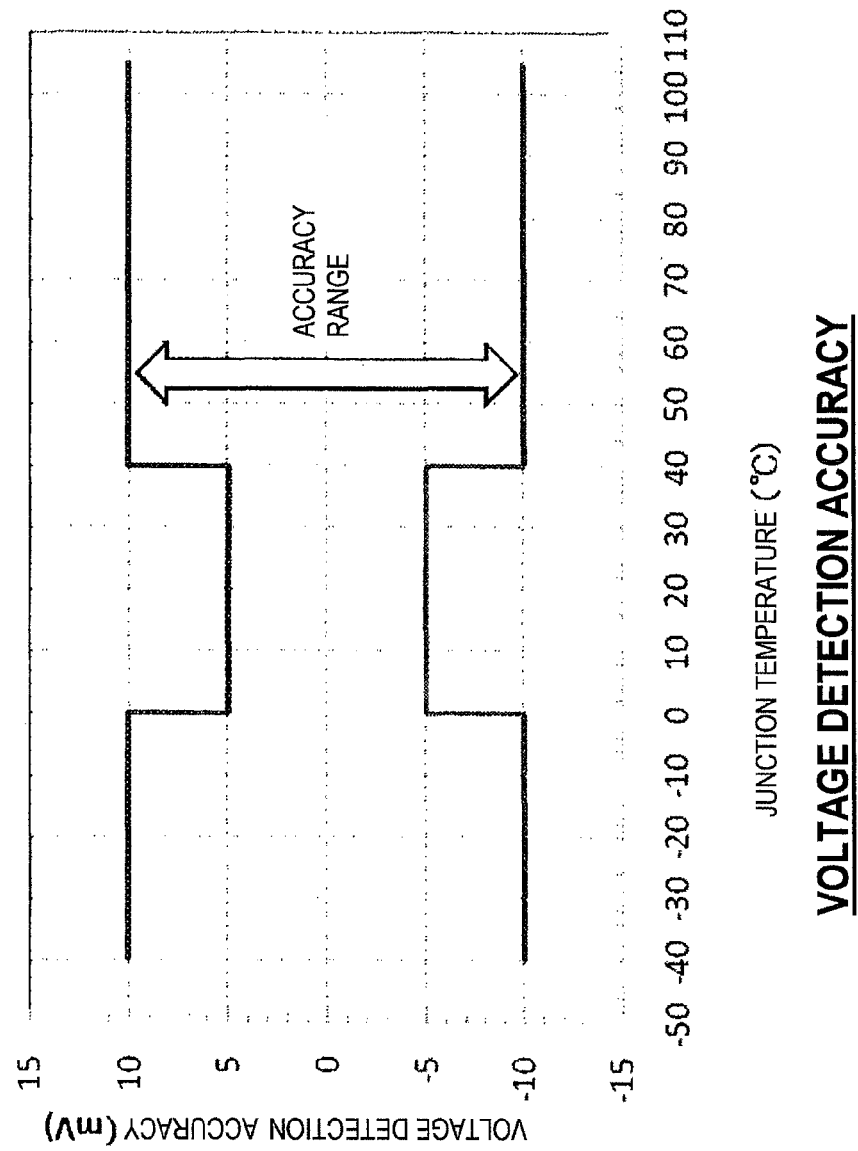
[FIG. 15]

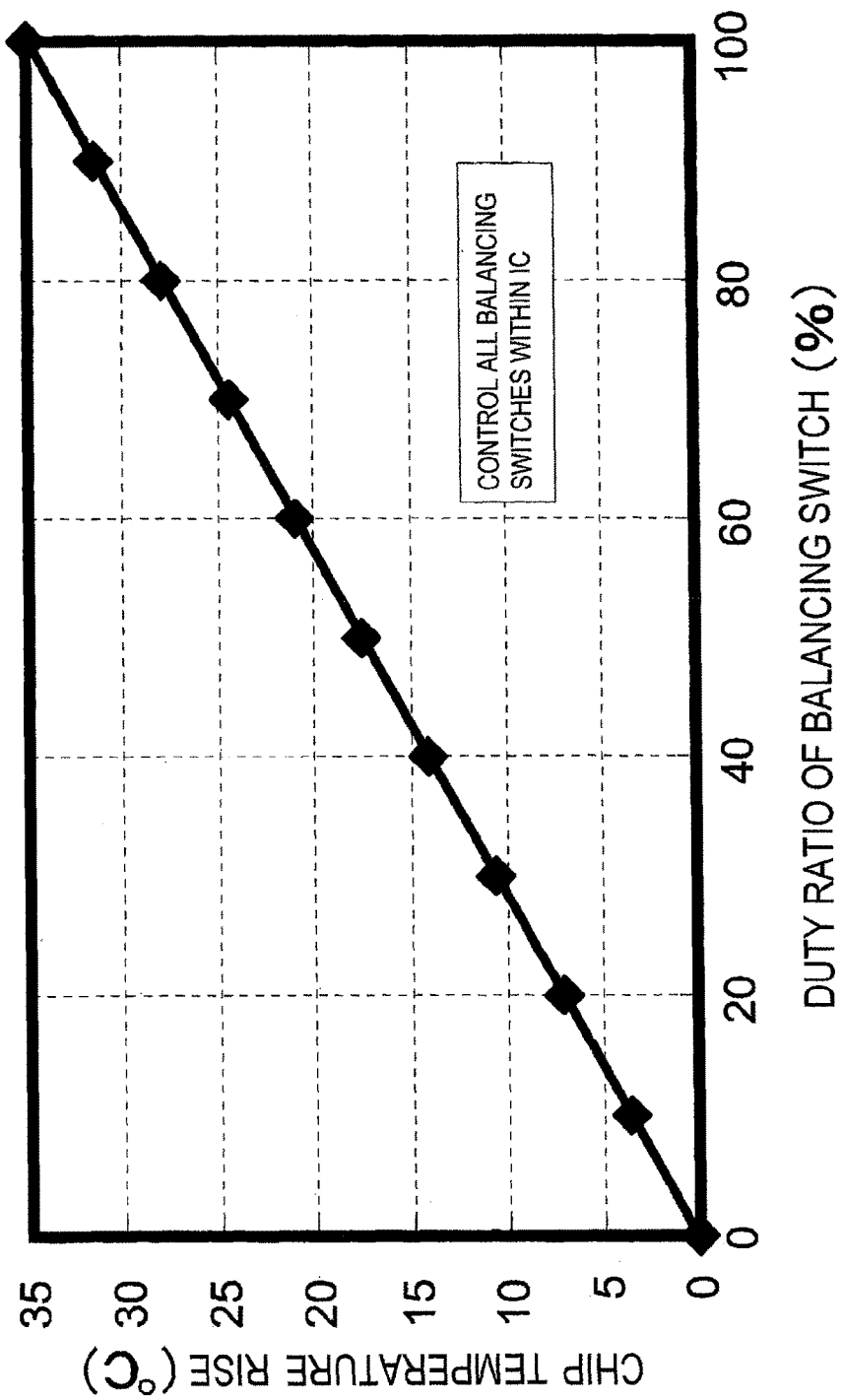
[FIG. 16]

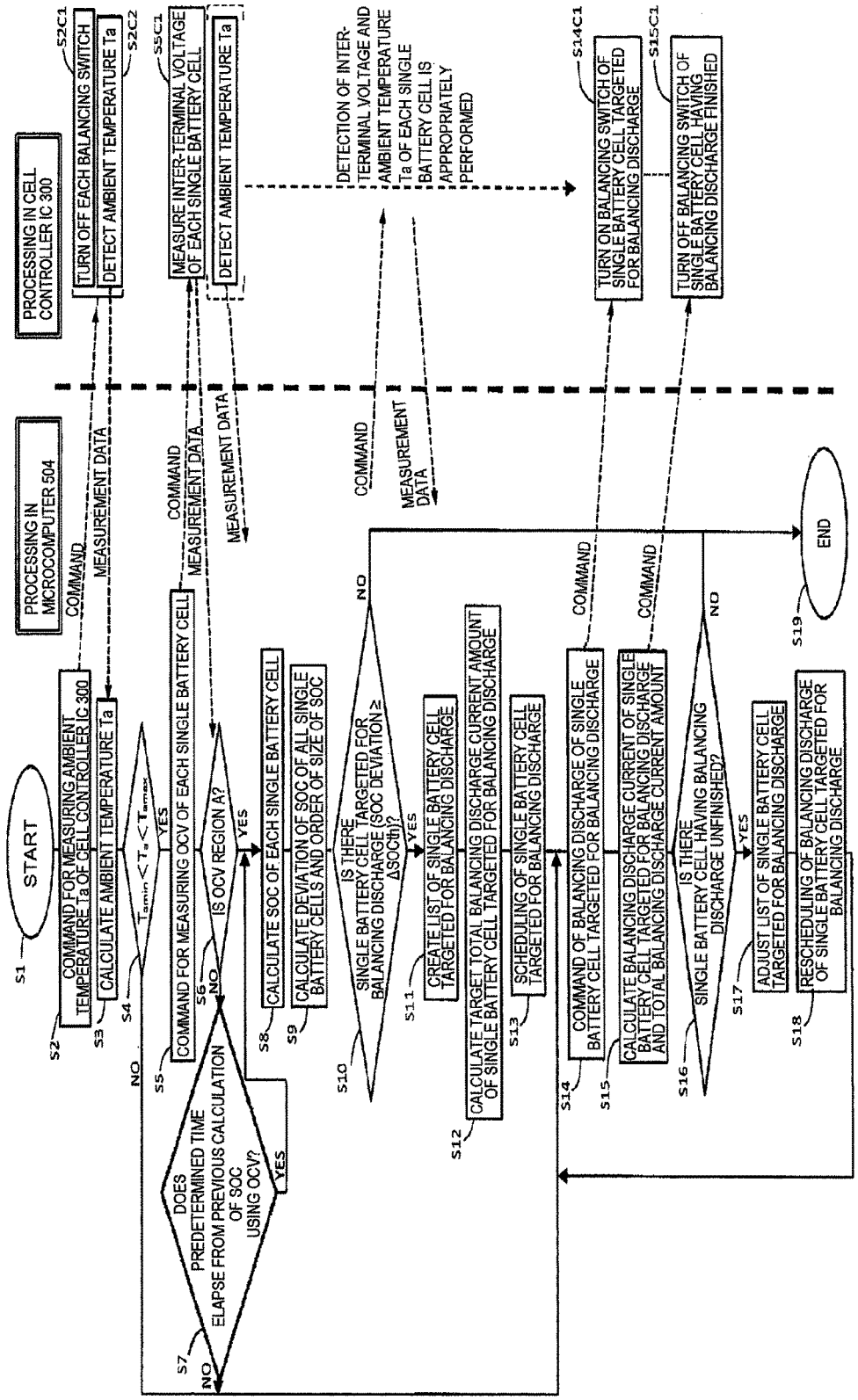
[FIG. 17]

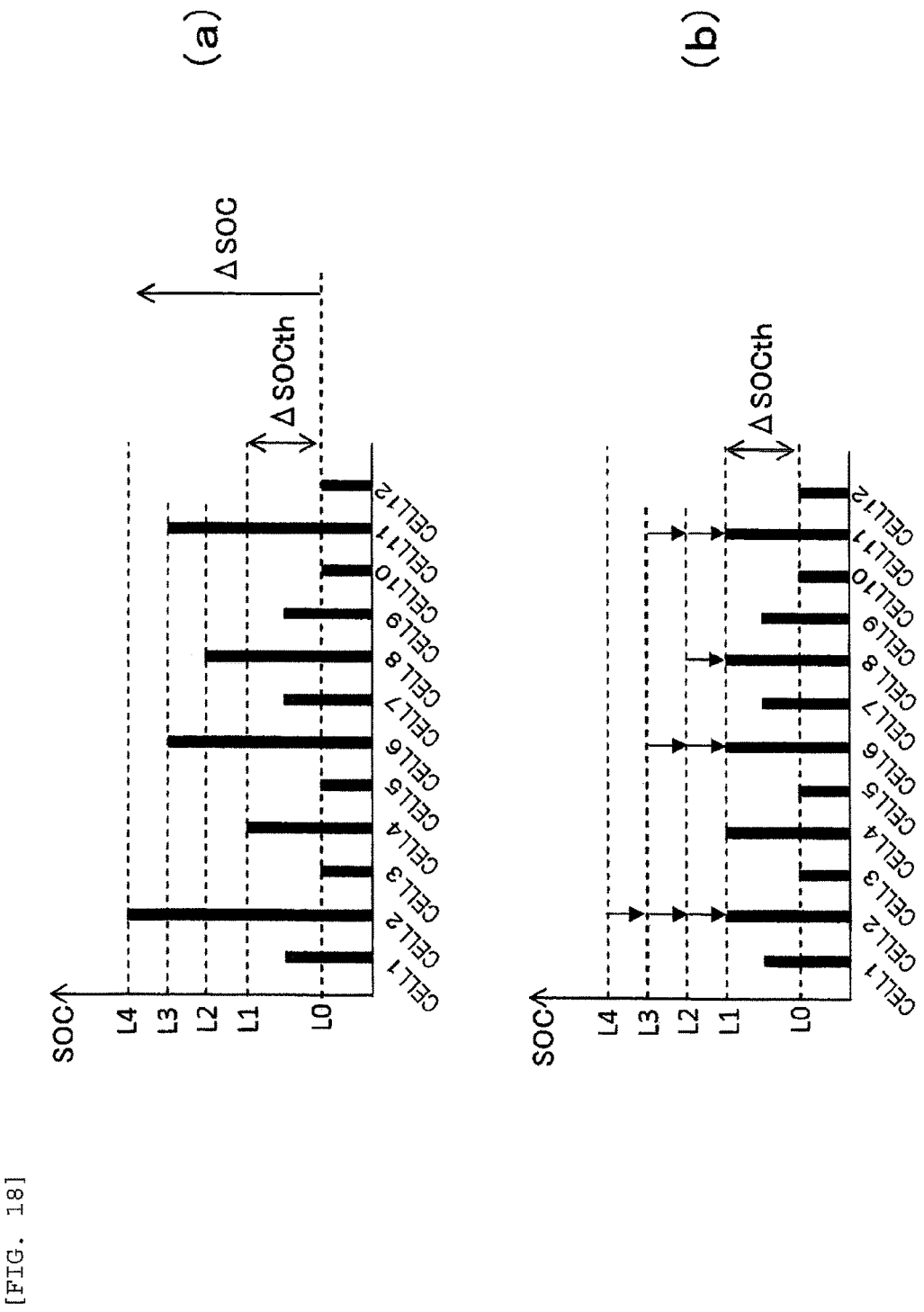
[FIG. 18]

BATTERY SYSTEM MONITORING DEVICE

TECHNICAL FIELD

The present invention relates to a battery system monitoring device.

BACKGROUND ART

In hybrid electric vehicles (HEV), electric vehicles (EV) and the like, assembled batteries (battery systems) having a large number of battery cells of a secondary battery connected in series to each other are used in order to secure a desired high voltage. In such assembled batteries, for the purpose of the capacity calculation, or the protection and management of each battery cell, an integrated circuit that performs the measurement of a cell voltage (inter-terminal voltage of a battery cell) and the equalization (balancing) of the state, of charge, that is, remaining capacity is used in a monitoring device of the assembled battery, to thereby manage the battery cell. In such an integrated circuit, not only are cell voltage measurement and equalization performed in order to improve reliability, but also various diagnoses including the disconnection detection of cell voltage detection lines are performed to improve reliability (see, for example, PTL 1).

In recent years, assembled batteries constituted by a secondary battery such as a lithium battery have had a drastic increase in applications for electric vehicles (EV) or plug-in hybrid electric vehicles (PHV). When the secondary battery is used in the EV or PHV, since the range of use of the SOC of such a secondary battery is wider than that used in hybrid electric vehicles (REV), and a fluctuation in SOC due to a large current output is more rapid, it is required to perform the voltage monitoring and diagnoses of all the cells at high speed. In addition, for the purpose of an improvement in the accuracy of voltage monitoring and diagnoses, it is required to improve the voltage measurement accuracy of all the cells over a wide range of use of the secondary battery.

Since a circuit that measures an inter-terminal voltage of the battery cell has temperature characteristics, the temperature of the voltage measurement circuit is required to set to be in a predetermined range, in order to improve the measurement accuracy of the inter-terminal voltage.

PTL 2 discloses a capacity adjustment device of an assembled battery that changes the magnitude of a bypass current for adjusting the capacity of a large number of battery cells, on the basis of the temperature in the vicinity of a bypass resistor.

PTL 3 discloses a capacity adjustment circuit that suppresses a rise in temperature during capacity adjustment by dividing a plurality of battery cells into a plurality of groups and selecting a timing for adjusting the capacity of each battery cell for each of the groups to thereby adjust the capacity of each battery cell.

CITATION LIST

Patent Literature

PTL 1: JP-A-2009-89488
PTL 2: JP-A-2006-115640
PTL 3: JP-A-2008-67460

SUMMARY OF INVENTION

Technical Problem

Balancing discharge for performing the equalization of the state of charge of each battery cell generates heat due to the on-resistance of a balancing switch within an integrated circuit, and thus influences the inter-terminal voltage measurement accuracy of a battery cell in the integrated circuit. In addition, polarization within the battery cell also influences the accuracy of an SOC estimated from an inter-terminal voltage. In the related art, balancing discharge corresponding to a method of calculating an SOC in consideration of voltage measurement accuracy in the integrated circuit has not been performed.

Solution to Problem (1) According to a first aspect of the present invention, there is provided a battery system monitoring device that monitors a battery system provided with a cell group having a plurality of battery cells connected in series to each other, including: a first control device that monitors and controls states of the plurality of battery cells of the cell group; a second control device that controls the first control device; a temperature detection unit that measures a temperature in the vicinity of the first control device; and a plurality of voltage detection lines, for measuring an inter-terminal voltage of the battery cell, which connect each of a positive electrode and a negative electrode of the battery cell and the first control device, wherein the first control device includes a balancing switch, connected between the voltage detection line connected to the positive electrode of the battery cell and the voltage detection line connected to the negative electrode, which performs balancing discharge of the battery cell for each of the battery cells, a first resistor is provided in series to the voltage detection line, a balancing discharge circuit constituted by the balancing switch and a second resistor connected in series to the balancing switch is connected between the voltage detection line connected to the positive electrode of the battery cell and the voltage detection line connected to the negative electrode, and a connection point between the balancing discharge circuit and the voltage detection line connected to the positive electrode of the battery cell and a connection point between the balancing discharge circuit and the voltage detection line connected to the negative electrode of the battery cell are provided at the cell group side rather than the first resistor.

(2) According to a second aspect of the present invention, in the battery system monitoring device of the first aspect, it is preferable that the first control device include: a selection unit that selects a voltage detection line connected to each of a positive electrode and a negative electrode of one battery cell or a temperature detection line connected to the temperature detection unit, and outputs a positive electrode potential and a negative electrode potential of the one battery cell or an output voltage of the temperature detection unit; and a voltage measurement unit that measures an inter-terminal voltage of the one battery cell or the output voltage of the temperature detection unit, from the positive electrode potential and the negative electrode potential of the one battery cell which are output from the selection unit or the output voltage of the temperature detection unit, and the second control device includes a storage unit that stores data for converting the output voltage of the temperature detection unit into a temperature.

(3) According to a third aspect of the present invention, in the battery system monitoring device of the first or second aspect, it is preferable that when the temperature in the vicinity of the first control device is equal to or less than a predetermined lower limit or equal to or greater than a predetermined upper limit during start-up of a vehicle having the battery system monitoring device mounted thereto, the second control device control the first control device to perform balancing discharge on a battery cell targeted for balancing discharge during previous stop of the vehicle.

(4) According to a fourth aspect of the present invention, in the battery system monitoring device of the first or second, aspect, it is preferable that when the temperature in the vicinity of the first control device is greater than a predetermined lower limit and is smaller than a predetermined upper limit during start-up of a vehicle having the battery system monitoring device mounted thereto, the second control device measure an inter-terminal voltage of each of the plurality of battery cells of the cell group in a state where a load that drives the vehicle is not connected to the battery system, calculate remaining capacity (SOC) of each of the plurality of battery cells, and perform balancing discharge on the basis of the SOC.

(5) According to a fifth aspect of the present invention, in the battery system monitoring device of the fourth aspect, it is preferable that when all the measured inter-terminal voltages of the plurality of battery cells fall within a predetermined voltage range, the second control device calculate an SOC of each of the plurality of battery cells and a deviation thereof, and control the first control device to perform balancing discharge of a battery cell having an SOC with a deviation equal to or more than a predetermined threshold.

(6) According to a sixth aspect of the present invention, in the battery system monitoring device of the fourth aspect, it is preferable that when the measured inter-terminal voltages of the plurality of battery cells do not fall within a predetermined voltage range at all, and a predetermined time elapses from a point of time at which a previous SOC is calculated using an OCV, the second control device calculate an SOC of each of the plurality of battery cells and a deviation thereof, and control the first control device to perform balancing discharge of a battery cell having an SOC with a deviation equal to or more than a predetermined threshold.

(7) According to a seventh aspect of the present invention, in the battery system monitoring device according to any one aspect of the fourth to sixth aspects, it is preferable that when the measured inter-terminal voltages of the plurality of battery cells do not fall within a predetermined voltage range at all, the second control device control the first control device to perform balancing discharge of a battery cell targeted for balancing discharge during previous stop of the vehicle.

(8) According to an eighth aspect of the present invention, in the battery system monitoring device of the fourth aspect, it is preferable to further include a current detection unit that detects a charge and discharge current of the battery system, wherein when the measured inter-terminal voltages of the plurality of battery cells do not fall within a predetermined voltage range at all, the second control device controls the first control device to perform balancing discharge of a battery cell targeted for balancing discharge during previous stop of the vehicle, and the SOC of each of the plurality of battery cells is calculated by integrating the charge and discharge current of the battery system detected by the current detection unit and a current of balancing discharge of the battery cell, to the SOC during previous stop of the vehicle.

(9) According to a ninth aspect of the present invention, in the battery system monitoring device of the third or seventh aspect, it is preferable that the second control device perform the balancing discharge of the battery cell targeted for the balancing discharge, with priority given to a battery cell having a large deviation for the SOC.

(10) According to a tenth aspect of the present invention, in the battery system monitoring device of the eighth aspect, it is preferable that the second control device perform the balancing discharge of the battery cell targeted for the balancing discharge, with priority given to a battery cell having a large deviation for the SOC.

(11) According to an eleventh aspect of the present invention, in the battery system monitoring device of the third, seventh, or ninth aspect, it is preferable that the second control device control a duty of a balancing switch corresponding to the battery cell targeted for the balancing discharge to perform the balancing discharge of the battery cell targeted for the balancing discharge so that the temperature in the vicinity of the first control device is less than the predetermined upper limit.

(12) According to a twelfth aspect of the present invention, in the battery system monitoring device of any one aspect of the first to eleventh aspects, it is preferable to further include: N (N≥1) cell groups connected in series to each other; M (M≥1) first control devices that control the N cell groups; and the second control device which is a high-order control device of the M first control devices, a highest-order first control device of the M first control devices and the second control device are connected to each other by the communication line through an insulating element, lowest-order first control device of the M first control devices and the second control device are connected to each other by the communication line through an insulating element, the M first control devices are connected to each other through the communication line, and the M first control devices are controlled by a control signal and control data from the second control device.

(13) According to a thirteenth aspect of the present invention, there is provided a battery system monitoring device that monitors a battery system provided with a cell group having a plurality of battery cells connected in series to each other, in which regarding OCV-SOC characteristics, the plurality of single cells having characteristics where a change in the OCV caused by a change in the SOC is small in a range of predetermined OCV, and a change in the OCV caused by a change in the SOC is large in a range other than the predetermined OCV, the battery system monitoring device including: a current detection unit that detects a charge and discharge current of the battery system; a first control device that monitors and controls states of the plurality of battery cells of the cell group; a second control device that controls the first control device; a voltage detection circuit that detects a voltage of the battery cell; a temperature detection unit that measures a temperature in the vicinity of the voltage detection circuit; and a balancing discharge circuit that performs balancing discharge control of reducing a variation in the SOC of the plurality of battery cells, wherein when the temperature of the voltage detection circuit detected by the temperature detection unit is in a predetermined temperature range, the SOC of each battery cell is calculated by a first SOC calculation method of calculating the SOC of each battery cell, on the basis of the OCV of the plurality of battery cells detected by the voltage detection circuit, and when the temperature of the voltage detection circuit detected by the temperature detection unit is out of the predetermined temperature range, the SOC of each battery cell is calculated by a second SOC calculation method of calculating the SOC of each battery cell by integrating the charge and discharge current of the battery system detected by the current detection unit and a balancing discharge current of each of the plurality of battery cells caused by the balancing discharge circuit.

(14) According to a fourteenth aspect of the present invention, in the battery system monitoring device of thirteenth aspect, it is preferable that when the temperature of the voltage detection circuit detected by the temperature detection unit is in the predetermined temperature range, the SOC of each battery cell be calculated by the first SOC calculation method, and first balancing discharge control in which an amount of heat generation of the balancing discharge circuit is suppressed be performed, and when the temperature of the voltage detection circuit detected by the temperature detection unit is out of the predetermined temperature range, the SOC of each battery cell be calculated by the second SOC calculation method, and second balancing discharge control in which the amount of heat generation of the balancing discharge circuit is not suppressed be performed.

Advantageous Effects of Invention

It is possible to perform balancing discharge without damaging the measurement accuracy of an inter-terminal voltage measurement circuit of a battery cell which is included in a battery system monitoring device by using the battery system, monitoring device according to the present invention. In addition, since the balancing discharge is performed in response to the measurement accuracy of the voltage measurement circuit, it is possible to perform efficient balancing discharge.

BRIEF DESCRIPTION OF DRAWINGS

FIG. 1 is a configuration example of an electromotive drive device of a hybrid electric vehicle provided with an electrical storage device having a battery system monitoring device according to the present invention incorporated therein.

FIG. 2 is a configuration example of an electromotive drive device of a hybrid electric vehicle provided with an electrical storage device having a total voltage detection circuit incorporated in a battery controller of the electrical storage device shown in FIG. 1.

FIG. 3 is a diagram illustrating a connection example of communication lines between a cell controller IC 300 within a cell controller 200 shown in FIG. 1 or FIG. 2 and a microcomputer 504 within a battery controller 500.

FIG. 4 is a diagram illustrating one more connection example of communication lines between the cell controller IC 300 within the cell controller 200 shown in FIG. 1 or FIG. 2 and the microcomputer 504 within the battery controller 500.

FIG. 5 is a diagram illustrating an internal configuration example of the cell controller IC 300.

FIG. 6 is a diagram illustrating a configuration example of a logic unit of the cell controller IC 300.

Figure 7:
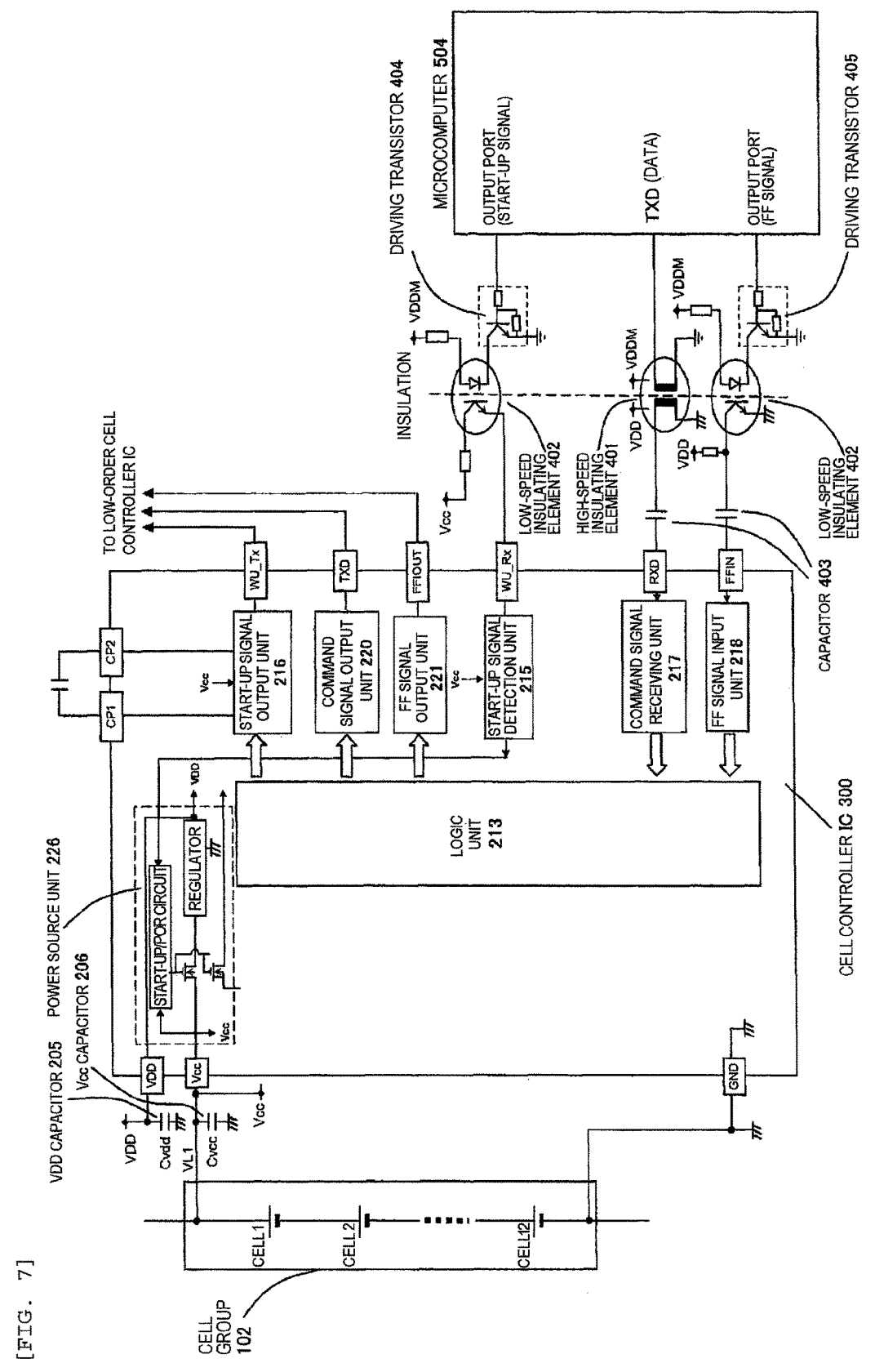

FIG. 7 is a diagram illustrating the connection of a start-up detection unit, a communication receiving unit, and an FF input unit to an external circuit when the cell controller IC 300 is set to be highest-order.

FIG. 8 is a diagram illustrating the details of the connection to the microcomputer 504 when the cell controller IC 300 is set to be lowest-order.

FIG. 9 is a diagram illustrating an internal configuration of a communication receiving unit of the cell controller IC 300.

FIG. 10 is a diagram illustrating a communication waveform example of an FSK system.

FIG. 11, is a schematic diagram of a circuit that inputs a block voltage to a multiplexer in order to measure the block voltage.

FIG. 12 is a schematic diagram of a circuit when an RC filter and voltage dividing resistors of a block voltage input unit 225 shown in FIG. 11 are installed outside the cell controller IC 300; FIG. 12(a) is an example when only a filter capacitor is installed outside, and FIG. 12(b) is an example when both the voltage dividing resistors and the filter capacitor are installed outside.

FIG. 13 is a diagram illustrating an example of OCV-SOC conversion curves of two secondary batteries having different characteristics.

FIG. 14 is a diagram illustrating SOC calculation errors in the secondary battery of type B shown in FIG. 13.

FIG. 15 is a diagram illustrating an example of a relationship between junction temperature of a semiconductor of a voltage measurement circuit and voltage measurement accuracy.

FIG. 16 is a diagram schematically illustrating a relationship between a duty ratio (%) of a balancing switch and a rise in temperature of a chip, of a cell controller IC.

FIG. 17 is a diagram illustrating the outline of a flow when a balancing discharge operation using the battery system monitoring device according to the present invention is performed on the secondary battery of type B described in FIGS. 13 and 14.

FIG. 18 is a diagram illustrating balancing discharge of a cell group constituted by twelve battery cells (cell 1 to cell 12).

DESCRIPTION OF EMBODIMENTS

Hereinafter, embodiments of the present invention will be described with reference to FIGS. 1 to 18. An embodiment described below is an example in which an electrical storage device provided with a battery system monitoring device according to the present invention is applied to an electrical storage device provided with a battery system used in a hybrid electric vehicle (HEV) and the like. Meanwhile, the present invention is not limited to the HEV, but can be widely applied to various types of electrical storage devices mounted to a plug-in hybrid electric vehicle (PHEV), an electric vehicle (EV), railroad vehicle, and the like.

In the following example, a charge and discharge device serving as a minimum unit to be controlled is assumed to be a Li-ion battery having a voltage in a range of 3.0 to 4.2 V (average output voltage: 3.6 V). However, as long as electrically chargeable and dischargeable devices, other than the battery, are employed in which the use thereof is restricted when SOC (State of Charge) is excessively high (over-charge) or excessively low (over-discharge), any of the devices may be employed. Herein, these devices are collectively called a single battery or a battery cell.

In the embodiment described below, a plurality of (approximately several to more than ten) battery cells connected in series to each other are called a cell group, and a plurality of cell groups connected in series to each other are called a battery module. Further, a plurality of cell groups or battery modules connected in series or in series-parallel to each other are called a battery system. The cell group, the battery module and the battery system are collectively called an assembled battery. A cell controller IC that detects a cell voltage of each battery cell, and monitors a battery state while performing a balancing operation or the like is provided for each cell group.

First, reference will be made to FIG. 1 to describe an example in which an electrical storage device according to the present invention is applied to a hybrid electric vehicle drive system.

An electrical storage device 100 is connected to an inverter 700 through relays 600 and 610, and the inverter 700 is connected to a motor 800. At the time of the start and acceleration of a vehicle, discharge electric power is supplied from the electrical storage device 100 through the inverter 700 to the motor 800, and assists an engine which is not shown in the drawing. At the time of the stop and deceleration of a vehicle, the electrical storage device 100 is charged with regenerative electric power from the motor 800 through the inverter 700. Meanwhile, herein, the inverter 700 includes an inverter circuit provided with a plurality of semiconductor switching elements, a gate drive circuit of a semiconductor switching element, and a motor controller that generates a pulse signal for performing PWM control on the gate drive circuit, which are not shown in FIG. 1.

The electrical storage device 100 is mainly constituted by a cell group 102 composed of a plurality of Li-ion battery cells 101, a battery system 104 having a plurality of cell groups 102 connected in series to each other, a cell controller 200 provided with a plurality of cell controller ICs 300 that detect a voltage of each of the battery cells 101 and perform a balancing discharge operation, and a battery controller 500 that controls an operation of the cell controller 200 and performs the state determination of each battery cell. In the example of the electrical storage device shown in the present embodiment, ninety-six Li-ion single cells, having a rated capacity of 5.5 Ah, which are connected in series to each other are used. The battery controller 500 communicates with the plurality of cell controller ICs 300 through an insulating element group 400, and controls these cell controller ICs. As mentioned above, the cell controller IC 300 is provided for each of the cell groups 102. Meanwhile, voltage detection lines between the battery system 104 and the cell controller 200 are connected to the cell controller 200 by connectors which are not shown in the drawing.

The battery controller 500 includes a current detection circuit 502 connected to a current sensor 503 that detects a charge and discharge current flowing to the battery system 104, a microcomputer 504 that performs control of the entire battery controller 500, including communication between the cell controller 200, and the inverter 700 and a high-order vehicle controller (not shown), and a storage unit 505. The storage unit 505 stores a variety of data, such as a voltage of each battery cell, a current value measured using the current sensor 503, and results of various disconnection diagnoses described later, which are associated with operations of the electrical storage device 100. The data includes data relating to the calculation of ambient temperature of the cell controller IC 300 and the calculation of temperature when balancing discharge is performed, which are described later.

In addition, a total voltage measurement circuit 701 that measures a total voltage of the battery system 104 is provided inside the inverter 700. In addition, the battery controller 500 performs temperature correction of a parameter of a battery state on the basis of the temperature of the battery cell 101 measured by a temperature detection circuit (not shown in FIG. 1) connected to the cell controller IC 300.

Meanwhile, the above-mentioned storage unit that stores the data for calculating the ambient temperature of the cell controller IC 300 may be provided in the cell controller IC 300 rather than the battery controller 500. In this case, data obtained by converting an output voltage of a temperature detection unit into temperature in a logic unit of the cell controller IC 300 is transmitted to the battery controller. In addition, for example, when the temperature correction of a resistor of a balancing switch 222 is performed, the retaining of the correction data for each cell controller IC has an advantage in the management thereof.

FIG. 2 is an example in which a total voltage detection circuit 501 is further installed in the battery controller 500. As described later, when the total voltage of the battery system 104 can be measured, the total voltage detection circuit 501 may not be provided inside the battery controller 500 as shown in FIG. 1.

Meanwhile, the cell controller 200 and the battery controller 500 are provided on one substrate which is not shown in FIGS. 1 and 2, and are stored in a case made of metal. In addition, the battery system 104 is also stored in a case made of metal. The cell controller 200 and the battery system 104 are connected to each other by a harness capable of bundling a plurality of voltage detection lines, connection lines of temperature sensors (not shown) of the battery cells, and the like.

The following operations are performed after the start-up of the electrical storage device 100. The battery controller 500 transmits a command for causing the cell controller 200 to measure OCV (open-circuit voltage) of all the battery cells, through the insulating element group 400. Data of the measured OCV of each battery cell is transmitted from the cell controller 200 through the insulating element group 400, in units of a cell group, to the battery controller 500. The battery controller 500 converts the received OCV of each battery cell into SOC, and calculates a deviation of the SOCs of all the battery cells. The battery cell having a deviation of the SOC larger than a predetermined value is targeted for the balancing discharge. The time until the deviation of the SOC of the battery cell targeted for the balancing discharge is equal to 0 is calculated, a command for performing a control operation of turning on the balancing switch within the cell controller IC 300 for only this time is sent from the battery controller 500 to the cell controller 200, and the balancing discharge of the battery cell targeted for balancing is performed.

After the SOC of the battery system 104 is calculated from the OCV of each of the battery cells measured above, the inverter 700 or a vehicle controller (not shown) which is a high-order controller turns on the relay 600 and the relay 610, and thus the electrical storage device 100 is connected to the inverter 700 and the motor 800. A charge and discharge command from the vehicle controller is then received by the inverter 700, the inverter 700 operates to drive the motor 800, and the charge and discharge operation of the electrical storage device 100 is performed.

From the time when the electrical storage device 100 starts charge and discharge by turning on the relay 600 and the relay 610, the battery controller 500 measures the charge and discharge current and the total voltage for each constant period of time. From the obtained values, of the total voltage and the charge and discharge current, the battery controller 500 calculates the state of charge (SOC) of, the assembled battery and the internal resistance (DCR) of the battery in real time (calculation method will be omitted). Further, the current or power with which the battery system 104 is capable of being charged and discharged is calculated from these values in real time and is transmitted to the inverter 700, and the inverter 700 controls the charge and discharge current or power within the range thereof. Meanwhile, in FIG. 1, the total voltage is not measured by the battery controller 500, but the total voltage value is obtained from the cell controller 200 by a method described later.

FIG. 3 is a diagram illustrating an example of communication connection between cell controller ICs 300*a* to 300*d* within the cell controller 200 and the microcomputer 504 within the battery controller 500. The microcomputer 504 includes a start-up signal output port that starts up the cell controller ICs 300*a* to 300*d* within the cell controller 200, a transmitting port TXD that transmits a command and data, and an FF signal output port that outputs a data packet (FF signal) for detecting the state of overcharge.

In the example of FIG. 3, a battery module 103 having two cell groups 102 connected in series to each other, the cell group having a plurality of battery cells connected in series to each other, is configured to be disposed at the top and bottom of a service disconnect switch (SD-SW) 105. The number of cell groups constituting the battery module 103 may be three or more without being limited to two. In addition, the cell controller ICs 300*a* to 300*d* are provided respectively corresponding to these cell groups 102*a* to 102*d*.

Meanwhile, herein, the cell controller IC 300*a* located at the lowermost side in FIG. 3 is set to a highest-order cell controller that initially receives a signal from the microcomputer 504. The cell controller IC 300*d* located at the uppermost side in FIG. 3 may be set to a highest-order cell controller.

Hereinafter, in case of simply referring to the cell controller IC or the cell controller IC 300, the cell controller ICs 300*a* to 300*d* are assumed not to be particularly limited thereto. In addition, similarly, the cell groups 102*a* to 102*d* are called the cell group or the cell group 102 in case where these cell groups are not particularly limited thereto.

The service disconnect switch (hereinafter, called the SD-SW) 105 is a switch which is commonly used in a high-voltage assembled battery, and has an aim of cutting off a current path of the assembled battery by the SD-SW 105 being opened during maintenance and inspection, and preventing a worker from getting an electric shock. The opening of the SD-SW 105 causes the series connection of batteries to be cut off. Therefore, even when a person touches a highest-order terminal and a lowest-order terminal of the assembled battery, a high voltage is not applied to a human body, and thus an electric shock can be prevented from happening.

In the communication lines of a command and a data signal, the command and the data signal are transmitted from the transmitting port TXD of the microcomputer 504 through high-speed insulating element 401 and a capacitor 403 to a communication receiving terminal RXD of the highest-order cell controller IC 300*a*. The start-up signal output port is connected to a start-up signal input terminal WU_Rx of the cell controller IC 300*a* through a low-speed insulating element 402. In addition, in the communication lines of an FF signal, the FF signal is transmitted from the FF signal output port through a low-speed insulating element 402 and the capacitor 403 to an FF input terminal. FEIN of the cell controller IC 300*a*. The highest-order cell controller IC 300*a* is configured such that a communication output terminal TXD thereof is connected to a communication receiving terminal RXD of, one low-order cell controller IC 300*b* by capacitor coupling, and an FF output terminal FFOUT thereof is connected to an FF input terminal FFIN of the cell controller IC 300*b* by capacitor coupling. In addition, a start-up output terminal WU_Tx of the cell controller IC 300*a* is, connected to a start-up signal input terminal WU_Rx of the one low-order cell controller IC 300*b*.

In the high-speed insulating element 401, the low-speed insulating element 402, and the capacitor 403, insulating elements used in a communication path between the microcomputer 504 and the highest-order cell controller IC 300*a* are collectively set to the insulating element group 400 (FIG. 1).

It is necessary to perform communication between the highest-order cell controller IC 300*c* of the cell controller IC connected to the upper battery module 103 of the service disconnect switch (SD-SW) 105 and the lowest-order cell controller IC 300*b* of the cell controller IC connected to the lower battery module 103, in an insulation manner. This is because a large number of battery cells connected in series to each other are present in the upper and lower battery modules 103, respectively, so the inter-terminal voltage of the battery module 103 increases. For this reason, the high-speed insulating element 401 is inserted into the communication lines of the command and the data signal, and the low-speed insulating element 402 is inserted into the communication line of the FF signal. If these communication lines are directly connected to each other, the assembled batteries are connected in series to each other through the connection, and the series connection of the assembled batteries are maintained even when the disconnection of the SD-SW 105 is performed. Therefore, the electrical conduction between the assembled batteries cannot be cut off, and thus there is the possibility of a worker getting an electric shock. Meanwhile, a start-up signal is also output from the start-up signal output port of the microcomputer 504 through, the low-speed insulating element 402 to the upper (lower-order side) cell controller IC 300*c* of the SD-SW 105 in FIG. 3.

In the lowest-order cell controller IC 300*d*, a communication output terminal TXD thereof is connected to a communication receiving port RXD of the microcomputer 504 through the high-speed insulating element 401. Similarly, an FF output terminal FFOUT of the cell controller IC 300*d* is connected to an FF signal input port of the microcomputer 504 through the low-speed insulating element 402.

When the cell controller 200 is started up, the microcomputer 504 outputs a start-up signal, and the cell controller IC 300*a* and the cell controller IC 300*c* receive the start-up signal through the low-speed insulating element 402 and are started up. The started-up cell controller IC outputs the start-up signal to the next cell controller IC. In this manner, all the cell controller ICs 300 are started up in order.

Meanwhile, an insulating element, such as photo-coupler, which is capable of transmitting even a DC signal is used in the low-speed insulating element 402, and the start-up signal from the microcomputer 504 to the cell controller IC 300*a* and the cell controller IC 300*c* employs a DC signal or a pulse signal having a relatively large duration. This is because noise or voltage fluctuation tends to be generated during the start-up of the electrical storage device 100, so the influence thereof is to be removed. A signal for starting up the next cell controller IC from the cell controller ICs 300*a* or 300*c* which are initially started up employs a short-pulse or AC-pulse signal.

After the start-up of the cell controller 200, the microcomputer 504 transmits a command signal and data (data packet) to the receiving terminal RXD of the cell controller IC 300*a* through the high-speed insulating element 401. The cell controller IC 300*a* receives the command signal and the data packet, and transmits the command signal and the data packet from the output terminal TXD to the next cell controller IC 300*b*. In this manner, all the cell controller ICs 300*a* to 300*d* receive the command signal and the data, and operate according to the command signal and the data. When data such as inter-terminal voltages (called cell voltages) of the battery cells of the cell groups 102*a* to 102*d* controlled by the cell controller ICs 300*a* to 300*d*, respectively, is obtained, each of the cell controller ICs 300*a* to 300*d* adds data to the data packet to transmit the added data from the transmitting terminal TXD to a RXD terminal of the next cell controller IC, and the transmitted data is finally received in an RXD terminal of the microcomputer 504. The microcomputer 504 receives a data packet including the command signal transmitted by the microcomputer. When command signal transmission is normally performed, and there is data added by the cell controller ICs 300*a* to 300*d*, the data is received.

Meanwhile, a loop of the FF signal routed through the FF input terminals FFIN and FF output terminals FFOUT of the cell controller ICs 300*a* to 300*d* is a loop for detecting the state of overcharge or over-discharge of the battery cell, and is a loop for detecting the detection reliability of overcharge important to secure the safety of a Li-ion battery cell in a separate system from the communication lines routed through the TXD terminal and the RXD terminal. The FF signal is assumed to be a square wave signal having a constant period. For example, the signal is assumed to have a square wave of 1 kHz in a normal state, and a square wave of 2 KHz in an overcharge state. When the square wave of 1 KHz is input to the FF input terminal FFIN, the cell controller IC 300 recognizes the high-order cell controller IC 300 to be in a normal state (non-overcharge state). When the cell voltage detection value of the cell controller IC 300 is detected to be an overcharge voltage, the square wave of 2 kHz is output to the FF output terminal FFOUT even in a case where the frequency of an input signal of the FF input terminal FFIN is either 1 kHz or 2 kHz, and the state of overcharge is output to the low-order cell controller IC 300. In addition, when the input signal of the FFIN terminal is a signal having frequencies other than 1 kHz or 2 kHz, a square wave is assumed not to be output to the FF output terminal FFOUT.

Even in a case where a certain cell controller IC 300 does not detect an overcharge voltage of the battery cell of the cell group controlled thereby, when the square wave of 2 kHz is input to the FF input terminal FFIN from another cell controller IC 300, the cell controller IC outputs the square wave of 2 kHz to the FF output terminal FFOUT. In this manner, in the FF signal loop, any of the cell controller ICs 300 outputs the detected overcharge, and the microcomputer 504 can detect overcharge in a separate path from a high-speed communication signal loop.

Meanwhile, the microcomputer 504 is generally assumed to output a square wave of 1 kHz, indicating a normal state, to the highest-order cell controller IC 300*a*. When the microcomputer 504 outputs a square wave of 2 kHz indicating overcharge, the microcomputer 504 can confirm that the FF loop normally operates when the square wave of the returned FF signal is 2 kHz even in a case where all the cell controller ICs 300*a* to 300*d* do not detect overcharge voltages. In addition, when a fault is generated in the FF loop, for example, when disconnection is generated, the square wave is not transmitted, and thus the state thereof can be identified.

FIG. 4 is a diagram illustrating an example in which the cell controller ICs 300*a* to 300*d* within the cell controller 200 and the microcomputer 504 within the battery controller 500 are connected to each other using another method. The difference from FIG. 3 is that the capacitor 403 is used in the communication connection line between switches 103 located at the intermediate point of the assembled battery through the connection of each line. The command signal and the FF signal are square wave signals having a short pulse, and data communication can be performed even when capacitor coupling is used. Therefore, such a circuit is adopted, and thus it is possible to reduce the number of insulating elements requiring a power source such as a photo-coupler, and to reduce current consumption due to such an insulating element.

FIG. 5 is a diagram illustrating an internal configuration of one cell controller IC 300. In addition, the schematic configuration of a logic unit 213 is shown in FIG. 6.

Here, the cell group 102 is constituted by twelve battery cells 101 (set to cells 1 to 12). The cell group 102 and the cell controller IC 300 that controls the cell group are connected to CV terminals (CV1 to CV13) for each voltage detection and BS terminals (BS01H to BS12H and BS01L to BS12L) for performing a balancing operation, through voltage detection lines SL1 to SL13 for performing voltage detection of each battery cell. Both ends of each battery cell, that is, a positive electrode terminal and a negative electrode terminal are connected to the CV terminal through a cell input resistor Rcv202, and a cell input capacitor Cin203 is connected to each CV terminal between the capacitor and a lowest-order GND terminal.

An RC filter is constituted by the cell input resistor Rcv202 and the cell input capacitor Cin203, and suppresses noise which is mainly caused by a ripple voltage superimposed on a cell voltage due to the operation of the inverter 700. Voltage terminals on both ends of the battery cell are connected to the balancing switch terminal (BS terminal) through a balancing resistor (Rb) 201. A balancing switch (BS) 222 passing a balancing current is connected to the inside of an IC. When the BS 222 is turned on, the balancing current of the cell flows through the balancing resistor 201. Meanwhile, a balancing terminal capacitor (Cb) 204 is connected between the BS terminals. This is for the purpose of preventing malfunction during a balancing switch diagnosis (the details thereof will not be given), and operates so that erroneous detection is not generated due to noise such as a ripple voltage which is caused by the operation of the inverter 700. Meanwhile, in FIG. 5, two balancing resistors 201 are provided for each balancing switch so as to interpose the balancing switch therebetween, but only one balancing resistor may be provided.

Meanwhile, the BS terminal for balancing discharge of each battery cell and the CV terminal for inter-terminal voltage measurement are respectively provided as dedicated terminals. In addition, a balancing discharge circuit constituted by the balancing resistor Rb201 and the balancing switch BS 222 is connected to the voltage detection line at the battery cell side rather than the cell input resistor Rcv202 Thereby, the balancing current does not flow through the cell input resistor Rcv202, and thus accurate inter-terminal voltage measurement can be made. In a normal state where disconnection is not present in the voltage detection line, the turn-on and turn-off of the balancing resistor Rb201 and the balancing terminal capacitor Cb204 of the balancing discharge circuit, and the balancing switch 222 do not influence the inter-terminal voltage measurement. In the related art, as disclosed in JP-A-2010-249793, a portion of a balancing discharge circuit is often common to an inter-terminal voltage measurement circuit (voltage detection line and cell input resistor), and is configured such that when the balancing discharge is performed, an inter-terminal voltage drops. Therefore, accurate inter-terminal voltage measurement has been made in a state where the balancing discharge is stopped.

In addition, the cell input capacitor Cin203 is connected between the voltage detection lines connected to the positive and negative electrodes of each battery cell in the related art, but the negative electrode side of the cell input capacitor Cin203 is connected to GND in the configuration according to the present invention. The adoption of such a circuit configuration causes the capacitor Cin203 not to be discharged by the turn-on and turn-off of the balancing switch in a normal state where disconnection is not present therein, and thus it is possible to accurately perform the inter-terminal voltage measurement each battery cell during the balancing discharge.

The CV terminal is connected to input terminals (Min terminals, Min1 to Min13) of a multiplexer 210 inside the cell controller IC 300. The multiplexer 210 selects each cell to output a positive electrode potential and a negative electrode potential, and is controlled by an output from a multiplexer input selection register 245 of the logic unit 213. The output of the multiplexer 210 is converted into an inter-terminal voltage of each battery cell through a differential amplifier 211, and the voltage is converted into a digital value of an AD converter 212. The operation of the AD converter 212 is controlled in the logic unit 213, and the output of the AD converter 212 is processed in the logic unit 213. That is, voltage measurement is performed in the differential amplifier 211 and the AD converter 212.

A high-speed AD converter such as, for example, successive approximation type is adopted in the AD converter 212: The use of such a high-speed AD converter allows the diagnosis of the multiplexer (the details thereof will not be given) or the like to be performed at high speed.

When a noise component is present in a signal, the high-speed AD converter detects the noise component as it is and performs AD conversion thereon. For this reason, each voltage detection line connected to the CV terminal for inter-terminal voltage measurement is provided with the cell input resistor Rcv202 and the cell input capacitor Cin203 to thereby form the RC filter, and after noise is removed, the signal is input to the AD converter 212 through the multiplexer 210 and the differential amplifier 211.

For example, the cutoff frequency of the RC filter of the CV terminal is set to approximately 50 Hz. Thereby, noise (approximately 20%, 20 kHz in p-p) caused by the switching of a semiconductor switching element of the inverter 700 can be set to be equal to or less than 1/100.

Meanwhile, the capacitor Cb204 connected to the balancing terminal (BS terminal) is a bypass capacitor provided for a noise countermeasure of the balancing switch. Since the time constant of the balancing discharge circuit of the RC filter constituted by the balancing resistor Rb201 and the balancing terminal capacitor Cb204 is small, the disconnection determination (the details thereof will not be given) in balancing current detection can be performed at high speed.

Meanwhile, the cutoff frequency of the RC filter of the CV terminal is set to be higher than above, and in order to remove the noise component which is not taken out accordingly, sampling is performed by the AD converter multiple times. Thus, the noise component can also be removed by averaging a plurality of sampling results.

In FIG. 5, lines from the positive electrodes or negative electrodes of the battery cells (cell 1 to cell 12) to the input terminals Min1 to Min13 of the multiplexer 210 are set to the voltage detection lines.

A multiplexer input short-circuiting switch 224 is provided between two adjacent voltage input lines, that is, the voltage detection line connected to the positive electrode of each battery cell and the voltage detection line connected to the negative electrode thereof, in the voltage input lines (that is, voltage detection lines) connected to the input terminals Min1 to Min13 of the multiplexer 210. The multiplexer input short-circuiting switches 224 corresponding to the respective battery cells are set to SWX1 to SWX12, respectively. In addition, each of the voltage input lines is provided with a resistor Rmpx for multiplexer input protection.

Meanwhile, the input terminals Min14 to Min17 of the multiplexer 210 are provided in order to input an output voltage from a block voltage input unit 225, and multiplexer input short-circuiting switches SWX14 to SWX16 are also provided between the input lines.

The cell controller IC 300 is provided with auxiliary input terminals AUXIN and AGND to which a temperature detection circuit 250 constituted by a thermistor 251, a thermistor dividing resistor 252, a thermistor input resistor 253, and a thermistor input capacitor 254 is connected. In FIG. 5, only a pair of one temperature detection circuit 250 and the auxiliary input terminals AUXIN and AGND are shown, but multiple sets of auxiliary input terminals are provided actually.

A circuit, such as the temperature detection circuit, which generates a voltage is connected to the auxiliary input terminal. A voltage from the circuit is selected in the multiplexer 210, and a voltage value digitized through the differential amplifier 211 and the AD converter 212 is input to the logic unit 213. In order to detect temperature within the cell controller 200 or temperature of the battery cell, a plurality of temperature detection circuits 250 are also provided, and the output voltages thereof are input to a plurality of auxiliary input terminals. In addition, similarly to the above-mentioned voltage detection lines, the output voltages are connected to the input terminals Min16 and Min17 of the multiplexer 210 through interconnections (referred to as temperature voltage detection lines) within the cell controller IC 300.

The resistance value of the thermistor 251 changes greatly depending on the temperature of the installation place thereof. A VDD voltage is divided by the thermistor 251 and the thermistor dividing resistor 252 connected in series to each other, and the inter-terminal voltage of the thermistor 251 is input from the auxiliary input terminals AUXMIN and AGND to the cell controller IC 300. The thermistor input resistor 253 and the thermistor input capacitor act as an RC filter that removes noise of a signal which is input to the auxiliary input terminal. That is, a voltage generated by the thermistor 251 corresponding to a change in temperature is denoised by the RC filter and is input to the cell controller IC 300.

The digitized inter-terminal voltage of the thermistor 251 is transmitted from the logic unit 213 through a command signal output unit 220 to a high-order control device (battery controller 500), and in the battery controller 500, the temperature of the place in which the thermistor 251 is installed is calculated from the inter-terminal voltage of the thermistor 251. The calculation of the temperature can be performed using a relational expression between the inter-terminal voltage and the temperature of the thermistor 251 dependent on the resistance-temperature characteristics of the thermistor 251, or data obtained by tabling a relation between the inter-terminal voltage and the temperature of the thermistor 251.

In the battery system monitoring device according to the present invention, as described later, the thermistor 251 is installed close to the cell controller IC 300, the temperature of the cell controller IC 300 is accurately measured, and the temperature of the inter-terminal voltage measurement circuit constituted by the differential amplifier 211, the AD converter 212 and the like is controlled so as to be set to be in a predetermined range. Thereby, it is configured to maintain the accuracy of a measured voltage value dependent on the temperature characteristics of the junction of a semiconductor element included in the voltage measurement circuit.

Meanwhile, a plurality of temperature detection circuits 250 are also used for measuring the temperature within the electrical storage device of the battery system or the battery monitoring device, transmitting information to a higher-order control device when abnormal temperature is detected, performing an operation of stopping the use of the battery system or changing control of a vehicle, and generating an alarm or the like to give notice to an operator of an electromotive vehicle.

FIG. 6 is a diagram illustrating the outline of the configuration of the logic unit 213. A detection voltage signal from the AD converter 212 is input to the logic unit 213, and the detection voltage signal is compared with a predetermined threshold in a voltage comparison unit 240. For example, when the detection voltage signal is larger than the predetermined threshold, a normal voltage is assumed to be detected, and a detection result of "1" is stored in a detection result register 241 in order of the measurement of an input selected in the multiplexer 210.

Meanwhile, when the detection of the presence or absence of a balancing, current or the diagnosis of the balancing switch 222 is performed by bringing a balancing switch state detection circuit 223 into operation, these results are directly stored in the detection result storage register 241 (see 2 of FIG. 5). Meanwhile, data of the diagnosis results of the balancing switch 222 is stored in the detection result storage register, 241, actually, through a potential conversion circuit (not shown), but the description thereof will be not given.

A disconnection determination unit 242 performs the disconnection determination of the voltage detection line on the basis of the detection results stored in the detection result register 241. The results of the disconnection determination of the voltage detection line are stored in a diagnosis result register 243.

Meanwhile, even when the measurement for the diagnoses of a circuit and a logic involved in the disconnection detection is performed, the measurement results are stored in the diagnosis result register 243. In the diagnoses of the circuit and the logic involved in the disconnection detection based on the measurement results in these diagnoses, with single continuous measurement, the diagnosis of a portion corresponding to the measurement is performed in the disconnection determination unit 242, and is stored in the diagnosis result register similarly.

As mentioned above, the output of the AD converter 212 is an inter-terminal voltage of the battery cell selected in the multiplexer 210, or a voltage between two voltage detection lines connected to the input terminals Min1 to Min13. In the normal operation of the electrical storage device 100 except for the disconnection detection and the diagnosis, the inter-terminal voltage of each battery cell is stored in a voltage measurement result register 244. Even when the disconnection detection is performed using the measured value of the inter-terminal voltage of the battery cell, the inter-terminal voltage of each battery cell is stored in the voltage measurement result register 244.

The disconnection detection results or the diagnosis results stored in the diagnosis result register 243, and the inter-terminal voltage of each battery cell stored in the voltage measurement result register 244 are transmitted, as mentioned above, from the cell controller IC 300 through the communication line to the high-order controller (battery controller 500).

Meanwhile, the details of the content and operation of the disconnection determination will be not given.

The logic unit 213 includes a register that controls various switches provided in the cell controller IC 300.

Data for selecting an input by switching a multiplexer 210 is stored in the multiplexer input selection register 245. Data for performing the diagnosis of the multiplexer to control the multiplexer input short-circuiting switch 224 is stored in a multiplexer diagnosis register 246. Data for controlling the turn-on and turn-off of the balancing switch 222 provided for each cell is stored in a balancing switch control register 247. Data for performing the diagnosis (the details thereof will not be given) of the balancing switch 222 to control a switch circuit of the balancing switch state detection circuit 223 is stored in a balancing switch state diagnosis register 248. Data for controlling a switch (not shown) within a sample and hold circuit (S/H) of the block voltage input unit 225 shown in FIG. 5 is stored in an S/H control register 249.

Meanwhile, the output of the multiplexer input selection register 245 is input to a multiplexer drive circuit in actuality, and the multiplexer 210 is driven by the output of the multiplexer drive circuit (not shown). In addition, similarly, the outputs of the multiplexer diagnosis register 246, the balancing switch control register 247, and the balancing switch diagnosis register 248 are connected to drive circuits (not shown), respectively, and switch circuits (not shown) of the multiplexer input short-circuiting switch 224, the balancing switch 222, and the balancing switch state detection circuit 223 are driven through the drive circuits. Here, for the purpose of simplification, these drive circuits are omitted.

An operation power source of the cell controller IC 300 is supplied from a Vcc terminal (see FIGS. 5, 7, and 8). A Vcc capacitor (Cvcc) 206 connected to the Vcc terminal is a capacitor for suppressing, noise. An inter-terminal voltage Vcc of the cell group 102 is input to the Vcc terminal through a power supply line VL1. As shown in FIGS. 5, 7, and 8, the power supply line VL1 is connected to the cell group side rather than the resistor Rcv202 in a highest-order voltage detection line SL1, or is connected to the positive electrode side of the cell 1 which is a highest-order cell of the cell group 102. The Vcc terminal is further connected to a power source unit 226 within the cell controller IC 300, and a regulator located therein supplies an operation power source VDD of 3.3 V to a circuit operating with a VDD power source including a logic unit. The power source VDD is connected to a VDD terminal of the cell controller IC 300. A VDD capacitor (Cvdd) 206 for operation stability is connected thereto, and also performs power source supply to a circuit operating with external Vdd.

The power source unit 226 includes a start-up signal detection circuit which is started up by the output of a start-up signal detection unit 215. When a start-up signal is received from the high-order cell controller IC or the microcomputer 504 through the insulating element 402, power source supply to the regulator is performed, and a startup and a POR (Power-On Reset) operation are performed. When the cell controller IC 300 is started up, a start-up signal output unit 216 operates with the output from the logic unit 213, and outputs a start-up signal to the low-order cell controller IC 300. Meanwhile, a capacitor is connected to the start-up signal output unit 216 at the outside of the cell controller IC 300. The capacitor is for performing a charge pump operation, and for generating a higher voltage by a setting voltage than a power source Vcc of the cell controller IC 300.

The Vcc terminal is connected to the start-up signal detection unit 215 at all times, and even in a state where the operation of the entire cell controller IC 300 is stopped, a power source is supplied only to the start-up signal detection unit 215. However, since the power source is supplied from the battery (cell group 102) in a state where the operation of the cell controller IC is stopped, the start-up signal detection unit 215 has a circuit configuration in which the current consumption thereof is reduced insofar as possible.

FIG. 7 is a diagram illustrating an example of the connection of the start-up signal detection unit 215, a command signal receiving unit 217, and an FF signal input unit 218 to an external circuit, with respect to the highest-order cell controller IC 300a of FIG. 3. When the cell controller IC 300 is set to be highest-order, a start-up signal input terminal uses a WU_RX terminal. The low-speed insulating element 402 for start-up which is a photo-coupler is connected to the terminal, and the microcomputer 504 passes a current through a driving transistor 404 to a diode of the low-speed insulating element 402 for start-up, so that the insulated transistor side is turned on. The transistor side of the low-speed insulating element 402 is configured such that the collector side is connected to Vcc of the cell controller IC 300 through a resistor, and Vcc is applied to the WU_RX terminal of the cell controller IC 300 when the transistor side is turned on. The start-up signal detection unit 215 is a comparator having a set threshold, and outputs a start-up detection signal to the power source unit 226 when the on-state of the transistor of the insulating element 402 is detected. With such a configuration, it is possible to reduce current consumption in the operation stop state as mentioned above.

In addition, a terminal RXD is used in the command signal receiving unit 217. The small-sized high-speed communication insulating element 401 using a transformer is connected to the terminal through the capacitor 403, and a communication signal is transmitted from the microcomputer 504. For example, a digital isolator is used in the insulating element for high-speed communication, but requires an operation power source even at the transmission side, unlike the photo-coupler. The operation power source is supplied by using the operation power source VDD of the cell controller IC 300 using the VDD terminal. Since the VDD is not output during the operation stop, a dark current does not flow during the operation stop. Meanwhile, the command signal receiving unit 217 detects a pulse signal, and the detected pulse signal is used as a digital communication signal in the logic unit 213.

In addition, a terminal FFIN is used in the FF signal input unit 218, and similarly to the case of the command signal receiving unit 217, an FF signal is transmitted by the microcomputer 504 driving a driving transistor 405 through the low-speed insulating element 402 which is a photo-coupler and the capacitor 403. Meanwhile, the FF signal input unit 218 detects a pulse signal, and the detected pulse signal is detected as an overcharge or over-discharge signal in the logic unit 213.

FIG. 8 is a diagram illustrating an example of the connection of the command signal output unit 220 and an FF signal output unit 221 to an external circuit, with respect to the lowest-order cell controller IC 300d of FIG. 3. A command output signal of the command signal output unit 220 is output from an output terminal TXD, and is received in a data receiving port RXD of the microcomputer 504 through the high-speed insulating element 401 for command signal communication. The high-speed insulating element 401 for communication using a transformer uses VDD of the cell controller IC 300 as a supply power source of the transmission side. An output signal terminal FFO of the FF signal output unit 221 drives the low-speed insulating element 402 for start-up which is a photo-coupler through a driving transistor 410, and an output signal from the photo-coupler is input to the FF signal input port of the microcomputer 504. Meanwhile, the receiving of the start-up signal which is output from the microcomputer 504 in all the cell controller ICs is confirmed by the FF signal output after the start-up of the lowest-order cell controller IC 300d being received in the microcomputer 504. The delivery of the signals through the low-speed and high-speed insulating elements 401 and 402 is the same as that described in FIG. 7, and thus the description thereof will not be given.

As shown in FIGS. 3, 4, and 7, the communication between the cell controller ICs 300 and the transmission of the FF signal are performed using the capacitor 403. The circuit configuration of a specific receiving unit is shown in FIG. 9. A load resistor to which a voltage of Vdd/2 is applied is connected to an input terminal RX on which capacitor coupling is performed, the terminal on the positive electrode side is connected to a comparator having hysteresis characteristics in which Vdd/2 is set to a threshold; and a pulse signal applied to the input terminal RX is regenerated as a command signal.

Meanwhile, since a direct-current component fluctuates depending on the DUTY ratio of the command signal in capacitor coupling; it is preferable that the DUTY ratio be 50% from the viewpoint of noise resistance. Therefore, the FF signal is set to have a square wave of which the DUTY ratio is 50%, but it is preferable that the high-speed communication signal be also a signal of which the DUTY ratio is 50%. The communication signal system includes an FSK (Frequency Shift Keying) system of changing a square-wave frequency with logics "0" and "1", or a PWM (Pulse Width Modulation) system of changing a square-wave pulse width with logics "0" and "1". The use of this system causes noise resistance to be increased, and thus reliability can be secured. FIG. 10 shows a communication waveform example of the FSK system. As shown in the drawing, since the pulse signal period during the transmission of data "1" is half the pulse signal period during the transmission of data "0", the duty ratio during data transmission is 50%, and thus high-reliability communication can be performed in the circuit configuration as shown in FIG. 9 without a direct-current component fluctuating.

In FIGS. 5, 7, and 8; the cell controller IC 300 shown at the upper side in the drawings is set to the lower-order controller IC 300, and the cell controller IC 300 shown at the lower side is set to the high-order cell controller IC 300. As shown in FIGS. 3 and 4, this is because, in the example of the electrical storage device according to the present invention, a command from the microcomputer 504 is initially transmitted to the cell controller IC shown at the lower side in the drawings, and the high order and the lower order of the cell controller are set on the basis of the order in a communication path. A circuit configuration may be used in which the command from the microcomputer 504 is initially received by the cell controller IC shown at the upper side in the drawings, and thus the high order and the lower order of the cell controller IC are not limited to the states shown in the drawings.

In addition, reference signs and numerals 102*a* to 102*d* of each cell group shown in FIGS. 3 and 4 are set to conform to the relationship between the high order and the low order of the cell controller IC shown herein, and the cell group located at the lowermost side in the drawings is set to 102*a*.

However, regarding the battery cell in each cell group, the potential of the battery cell located at the upper side in the drawings is high, and thus the battery cell shown at the upper side in the drawings is set to a high-order battery cell.

(Block Voltage Measurement)

FIG. 11 is a diagram illustrating a circuit that measures a block voltage. As shown in FIG. 2, the battery controller 500 does not include a total voltage measurement circuit. Instead, when a command for measuring a total voltage of the battery system 104 is received from the high-order controller (inverter or vehicle controller) through CAN (Controller Area Network) communication, the battery controller 500 transmits a command, for substantially simultaneously measuring a voltage (called a block voltage) of the entire cell group of each of a plurality of cell groups of the battery system 104, to a plurality of cell controller ICs 300, as described in FIGS. 3 and 4. Each of the cell controller ICs 300 measures the voltage (block voltage) of the entire cell group constituted by twelve battery cells targeted for control, and the battery controller 500 receives the data thereof through communication to integrate the respective block voltages, and sets the resultant as a total voltage of the battery system 104.

(Block Voltage Measurement Using Broadcast Command)

In this case, the battery controller 500 issues a command, for measuring the block voltage of the cell group controlled by each cell controller IC using a single command, to all the cell controller ICs 300. This command does not specify the cell controller IC 300 having a specific address, but is performed on all the cell controller ICs 300 through one-time command transmission. Since the timing at which the command of the block voltage measurement is received by each of the cell controller ICs 300 is delayed due to the transmission path length of a signal, differences of a μsec order occur, and thus the timing at which the block voltage measurement is performed by each of the cell controller ICs is also shifted in a μsec order. However, a filter having a low cutoff frequency is put into the block voltage input unit 225 as described below, and regarding the timing differences of a μsec order, the differences almost do not occur in the measured values of the block voltage. Therefore, the measurements of the respective block voltages can be regarded to be performed at almost the same time, and the measurement of the total voltage of the battery system 104 is not influenced.

In this manner, the block voltage measurement using a broadcast command is performed, and thus all the cell controller ICs measure the inter-terminal voltages of the respective cell groups corresponding thereto at almost the same time. The high-order controller (battery controller 500) reads the inter-terminal voltages of the respective cell groups through the communication line, and thus the inter-terminal voltages can be set to the total voltage of the assembled battery by taking the sum of these voltages.

As shown in FIG. 11, the voltage of the entirety of one cell group, that is the inter-terminal voltage (=block voltage) of one cell group is applied to the power source unit 226 through the Vcc terminal. The power source unit 226 has a block voltage electrification switch 230 built in, and the switch is turned on when the cell controller IC 300 is started up. The output voltage of the block voltage electrification switch 230 is divided by voltage dividing resistors 231 and 232 using high resistors with high accuracy, and is input to a sample and hold circuit 236 through a filter resistor 233 and a filter capacitor 234 which constitute an RC filter for noise removal. The cutoff frequency of the RC filter is set to be at the same level as the cutoff frequency of the RC filter of the CV terminal mentioned above.

The sample and hold circuit 236 is controlled in the logic unit 213, and the above-mentioned divided block voltage is held in the sample and hold capacitor 236. The output of the sample and hold circuit 236 is input to the multiplexer 210 through the multiplexer input short-circuiting switch 224 described later. During the block voltage measurement, the input switching of the multiplexer 210 is specified from the logic unit 213, and the block voltage divided into an input 15 and an input 17 is input thereto. The divided block voltage which is input to the multiplexer is further converted into a digital value by the AD converter 212 through the differential amplifier 211 (see FIG. 5). Meanwhile, a switch (not shown) within the sample and hold circuit 236 is controlled so as to be turned on when sample and hold is performed, by the output of the S/H control register 249 of the logic unit 213.

The measurements of the inter-terminal voltages of each cell group using the block voltage measurement are simultaneously performed by the broadcast command as mentioned above, separately from the measurement of the inter-terminal voltage of each battery cell of the cell group. In addition, since the total voltage of the battery system 104 is required to be monitored at all times, the block voltage measurement is frequently performed at substantially regular intervals (for example, every 100 ms).

When the sample and hold circuit 236 performs the inter-terminal voltage measurement and the like of each battery cell in a disconnection diagnosis described later, the measurement is terminated, and then the inter-terminal voltage of the cell group and the inter-terminal voltage of each battery cell of the cell group are transmitted to the high-order controller (battery controller 500) at the same time, and thus it is necessary to hold the measurement results of the block voltage until the inter-terminal voltage measurement of the battery cell in the disconnection diagnosis is terminated. Therefore, it is not necessary to provide the sample and hold circuit 236 when the disconnection diagnosis is not performed.

Meanwhile, from voltages obtained by dividing the inter-terminal voltage (block voltage) of each cell group mentioned above, the inter-terminal voltage value of each cell group is calculated in the high-order controller (battery controller 500), using resistance values of the voltage dividing resistors 231 and 232. The sum of the inter-terminal voltages of all the cell groups is obtained as the total voltage of the assembled battery.

(Dark Current Cutoff of Block Voltage Input Unit 225)

In addition, the reason for providing the block voltage electrification switch 230 is to cut off a current flowing to the voltage dividing resistors 231 and 232 during the operation stop of the cell controller IC 300, and to reduce a dark current.

(Frequency Characteristics Setting of RC Filter by External Connection of Filter Capacitor)

Meanwhile, the filter resistor 233 constituting the above-mentioned RC filter can be omitted by replacing the function thereof with the voltage dividing resistor 231. Further, the filter capacitor 234 is installed outside the cell controller IC 300, and the capacity of the filter capacitor 234 is appropriately selected, thereby allowing the RC filter to have desired frequency characteristics.

FIG. 12(a) shows an example of the circuit in this case, and particularly shows the extracted portion of the block voltage input unit 225 of FIG. 10. Here, an external connection terminal VblkF is provided in order to install the filter capacitor 234 outside the cell controller IC 300.

In addition, when the cell controller IC 300 cannot have a high-accuracy voltage dividing resistor built in, for example, as shown in FIG. 12(b), the voltage dividing resistors 231 and 232 may be installed outside the cell controller IC 300 by further providing an external connection terminal Vvd. Here, the external connection terminal Vvd is further provided in order to install the voltage dividing resistors 231 and 232 outside the cell controller IC 300.

(Balancing Discharge Control in Battery System Monitoring Device According to the Present Invention)

In balancing discharge control of the battery system monitoring device according to the present invention, the SOC of each battery cell is calculated by measuring an OCV during vehicle start-up. The balancing discharge is performed so that the SOCs of the battery cells are equalized on the basis of the calculated SOC. However, in order that the inter-terminal voltage of the battery cell is measured with required accuracy by controlling an effective discharge current of the balancing discharge to suppress the generation of heat due to a balancing discharge current, the temperature of the voltage measurement circuit that measures such an inter-terminal voltage is set to be in a predetermined range.

Hereinafter, basic operations of the balancing discharge control will be first described, and the entire operation flow will be further described.

(OCV-SOC Characteristics of Secondary Battery)

Even when a secondary battery is a secondary battery belonging to, for example, Li-ion batteries, the battery is known to have a different OCV-SOC conversion curve which is a characteristic curve indicating a relationship between the OCV and the SOC, depending on the difference in internal electrode material. FIG. 13 shows an example of two secondary batteries having different characteristics. Meanwhile, the OCV-SOC conversion curves are in a stable state where the polarization of the battery cell is not present. When charge and discharge are performed in a state where a load such as an inverter is connected to the battery system, particularly the central portions of the conversion curves vertically move depending on the state of the polarization inside the battery.

In a secondary battery of type A, the OCV and the SOC have a substantially linear relation, in the entire region where the SOC is 100% to 0%. That is, in the secondary battery of type A, when the influence of polarization can be ignored, the SOC is obtained from the measured OCV (open-circuit voltage) with good accuracy, in the entire region of FIG. 13.

On the other hand, in a secondary battery of type B, the OCV and the SOC have a linear relation similar to the secondary battery of type A, in a region (portion A of FIG. 14) where the SOC is equal to or more than 60%. However, the OCV and the SOC deviate greatly from the linear relation, in a portion where the SOC is equal to or less than 60%, and thus the portion becomes a region (portion B of FIG. 14) where the OCV is not much changed in contrast to the change of the SOC.

When the SOC is calculated from the OCV in the region B of FIG. 14, the accuracy thereof is lower than that calculated in the region A. Two curves C and D shown in the lower side of FIG. 14 indicate calculation errors of the SOC, respectively, when measurement errors of the OCV are 15 mV and 10 mV.

Therefore, in the balancing discharge control in the battery system monitoring device according to the present invention, in order to calculate the SOC with a good level of accuracy with respect to the secondary battery such as type B, it is preferable to use the OCV-SOC conversion curve in the region B.

When the battery system constituted by the secondary battery having characteristics such as type B is used, the charge and discharge control of the battery system is performed using a previous SOC value stored in, for example, the high-order controller (battery controller 500) in a case where the SOC calculated from the OCV is present in the region B during electromotive vehicle start-up. That is, in the SOC in this case, the previous SOC value and the integrated value of the charge and discharge current and the balancing discharge current are used (described later).

However, in some cases, using the secondary battery in the region B is also considered. This has an advantage that the OCV has a small fluctuation in contrast to the fluctuation of the SOC, that is, the inter-terminal voltage is stable. In addition, when the SOC is calculated using the integrated value of the currents for a long period of time, errors of the detected current values caused by the relationship between a fluctuation in the charge and discharge current and a current detection timing using the current sensor 503, and the current detection accuracy itself are accumulated, and thus the SOC calculated using the integrated value of the currents deviates from an actual SOC.

In such a case, even in the region B, the calculation of the SOC using the OCV-SOC conversion curve allows an accurate value to be obtained. In addition, when the measurement error of the OCV is reduced by performing the suppression of noise or the like, for example, with the average of multiple voltage measurements, more accurate SOC can be calculated.

The multiple voltage measurements take a certain time, and thus the most accurate SOC is calculated according to the situation, appropriately using SOC calculation means of various methods mentioned above. For example, in a case where a predetermined time elapses from a point of time at which a previous OCV is measured, the SOC is calculated by measuring the OCV even when the state of the secondary battery is located at the region B during vehicle start-up.

In this manner, two SOC calculation methods are selected and used, and thus an optimum SOC calculation method, that is, a method of calculating a more accurate SOC in the characteristics of the secondary battery and the state of use thereof can be used in accordance with the characteristics of the secondary battery and the state of use thereof. Thereby, it is possible to efficiently operate the battery system and avoid over-discharge and overcharge, and to drive a vehicle stably.

Meanwhile, even during the start-up of an electromotive vehicle, in a case where a predetermined time does not elapse from a previous point of time at which the electromotive vehicle is stopped, the polarization of the battery cell is not solved, and the OCV does not have values on the characteristic curve as shown in FIG. 13. Therefore, when the OCV is measured and then the SOC is calculated, a predetermined time has to elapse from the previous point of time at which the vehicle is stopped. When a predetermined time has not elapsed, an SOC value calculated and stored further previously is used. Such a predetermined time varies according to the specification of the secondary battery, but is approximately several hours, for example, in a Li-ion battery. In addition, in a lead storage battery, the polarization solution time is longer than that in the Li-ion battery.

(Junction Temperature and Balancing Discharge Control)

FIG. 15 is a diagram illustrating an example of a relationship between the junction temperature of semiconductor included in a voltage measurement circuit (differential amplifier 211 or AD converter 212 of FIG. 5) and the voltage measurement accuracy measured by the voltage measurement circuit. At the junction temperature of 0° C. to 40° C., the characteristics of various semiconductors in the inter-terminal voltage measurement circuit are made uniform, and the voltage detection accuracy is set to ±5 mV. In addition, at the temperatures other than 0° C. to 40° C., the voltage detection accuracy is set to ±10 mV.

This shows that when the inter-terminal voltage of the battery cell is measured with good accuracy, the measurement is required to be performed at the junction temperature of 0° C. to 40° C.

(Influence of Heat Generation of Balancing Switch 222 on Junction Temperature)

The junction temperature $T_j$ is calculated using the following Expression (1) from the temperature $T_a$ in the vicinity of the cell controller IC 300 measured using the above-mentioned temperature detection circuit 250 (see FIG. 5).

$$T_j = T_a + \Theta_{ja} \cdot (P_0 + P_{BS}) \quad (1)$$

where, $T_j$: junction temperature, $T_a$: ambient temperature (temperature of the installation place of the thermistor 251) of the cell controller IC 300, $\Theta_{ja}$: temperature resistance between the junction and the thermistor 251, including a package of the cell controller IC 300, $P_0$: power consumption of the cell controller IC 300 when the balancing discharge is not performed thereon, and $P_{BS}$: power consumption by the on-resistance of the balancing switch in the balancing discharge.

Meanwhile, the voltage measurement circuit and the balancing switch 222 are located within one chip of the cell controller IC 300, and the junction temperatures thereof are substantially the same as each other within the chip. In addition, the influence of heat generation due to the balancing resistor 201 during the balancing discharge is transferred to the ambient temperature $T_a$ of the cell controller IC 300.

The temperature resistance $\Theta_{ja}$ between the junction and the thermistor 251 may be calculated from thermal resistance of a known IC package, thermal resistance of a substrate between the cell controller IC 300 and the thermistor 251, and the like. Alternatively, the temperature resistance may be obtained experimentally by creating the same structure as that of the configuration of the actual battery monitoring device.

(Power Consumption by on-Resistance of Balancing Switch)

The power consumption $P_{BS}$ during the balancing discharge in one balancing switch 222 is obtained from the following expression where the inter-terminal voltage of one battery cell is set to $V_{CCV}$, the resistance value of the balancing resistor 201 is set to $R_b$, and the on-resistance of the balancing switch 222 is set to $R_{BS}$ (see FIG. 5)

$$P_{BS} = V_{CCV}^2 \cdot R_{BS} (2 \cdot R_b + R_{BS})^2 \quad (2)$$

The balancing resistor 201 is an external resistor of the cell controller IC 300, and a resistor excellent in accuracy is used as the balancing resistor. The on-resistance value $R_{BS}$ of the balancing switch 222 shows a certain level of variation in a process of manufacturing a semiconductor chip of the cell controller IC 300.

The resistance value Rb of the balancing resistor 201 is determined depending on the capacity of the battery cell, the variation of the remaining capacity of a plurality of battery cells constituting the cell group or the assembled battery, or whether such a variation is solved by the balancing discharge over time to some extent, but the description thereof will not be given herein.

The capacity of the battery cell tends to increase every year, and thus it is required to increase the balancing current with this tendency and rapidly perform the equalization of the remaining capacity of the battery cells. Therefore, the resistance value of the balancing resistor 201 tends to decrease, but is set to have a relation of $R_{BS} < R_b$ under present circumstances. Since the balancing switch 222 is constituted by a MOSFET, it is preferable that Rb is set to be larger than the average resistance value of the balancing switch, in consideration of its temperature characteristics.

Alternatively, the on-resistance value $R_{BS}$ of each balancing switch 222 of the cell controller IC 300 may be measured, and then power consumption by the on-resistance $R_{BS}$ of the balancing switch 222 may be obtained using above Expression (2)

Further, as described later, the accurate on-resistance $R_{BS}$ of the balancing switch 222 is obtained by calculation, from the balancing discharge time of each battery cell calculated from the balancing discharge current amount (that is, correction amount of the SOC), the balancing resistance value $R_b$ and the on-resistance value $R_{BS}$ of the balancing switch, and the balancing discharge time taken actually, and thus this value may be used.

Herein, for the purpose of simplifying the following description, the above Expression (2) is expressed as follows.

$$P_{BS} = V_{CCV}^2 \cdot F_{BS} \quad (3)$$

$F_{BS}$ is a coefficient dependent on the on-resistance value of the balancing switch 222.

In FIG. 15, similarly to a case where the cell controller IC 300 is designed so as to be capable of maintaining good voltage detection accuracy in the range of the junction temperature of 0° C. to 40° C., the balancing switch 222 can also be designed by the addition of, for example, a temperature compensation circuit so that the temperature change of the on-resistance $R_{BS}$ of the balancing switch 222 can be ignored in the coefficient $F_{BS}$ in such a temperature range.

The following expression is obtained by comparing Expression (1) with Expression (2)

$$F_{BS} = R_{BS}/(2 \cdot R_b + R_{BS})^2 \quad (4)$$

When the on-resistance of the balancing switch 222 is not measured, on the assumption that the relation of $F_{BS} = 1/(2 \cdot R_b)$ is established by ignoring the on-resistance of the balancing switch 222 while maintaining the temperature range of, for example, 0° C. to 40° C., the balancing discharge of one battery cell is performed for a predetermined time t, and the SOC of the battery cell is reduced from SOC0 to SOC1. Meanwhile, SOC0 and SOC1 are respectively obtained from the OCV-SOC conversion curves as shown in FIG. 13 by measuring the OCV (open-circuit voltage) of the battery cell.

Balancing current Ib0 when the on-resistance $R_{BS}$ of the balancing switch 222 is ignored is expressed as follows, using the inter-terminal voltage $V_{CCV}$ of Expression (3) (herein, for the purpose of description, the change of the inter-terminal voltage due to polarization or the like is ignored).

$$Ib0 = V_{CCV}/(2 \cdot R_b) \quad (5)$$

Therefore when $F_{BS} = 1/(2 \cdot R_b)$ is assumed to be a correct coefficient, the following expression is obtained.

$$SOC0 - SOC1 = Ib0 \cdot t \quad (6)$$

However, actually, the following expression is obtained.

$$SOC0 - SOC1 = Ib1 \cdot t \neq Ib0 \cdot t \quad (7)$$

Herein, Ib1 is a correct balancing current, and thus the following expression is established.

$$Ib1 = V_{CCV}/(2 \cdot R_b + R_{BS}) \quad (8)$$

The following expression is established by comparing the above Expressions (5) and (8), $$R_{BS} = 2 \cdot R_b \cdot (Ib0 - Ib1)/Ib0 \quad (9)$$

and the resistance value $R_{BS}$ of the balancing switch 222 can be obtained.

However, in such a method, there is an influence of polarization when the discharge current amount due to the balancing current is large, and thus the OCV is measured in a state where the polarization is solved, to obtain the resistance value $R_{BS}$ and the balancing discharge current Ib1 of the balancing switch 222 from Expressions (8) and (9). In addition, when the time during each OCV measurement for the calculation of SOC0 and SOC1 is long, the influence of self-discharge of the battery cell also occurs. Therefore, it is required to calculate $R_{BS}$ in further consideration of these influences, or under conditions of having no influences.

As stated above, the resistance value $R_{BS}$ of the balancing switch 222 is obtained in a desired method, and thus it is possible to calculate the coefficient $P_{BS}$ in Expression (4), and to calculate the power consumption $P_{BS}$ in the balancing switch 222 through Expression (3).

(Balancing Discharge Time and Balancing Discharge Control of Each Battery cell)

Using the OCV measured during the start-up of the electromotive vehicle such as the HEV, the PHEV, and the EV, an initial SOC is first obtained on the basis of the OCV-SOC conversion curves of FIG. 13. A case of one battery cell will be described by way of example.

An initial value of the SOC of the battery cell is set to SOC0. When the charge and discharge current between the battery system 104 and the inverter 800 in a case where the electrical storage device 100 and the inverter 800 are connected to each other is set to I, and the balancing discharge current is set to Ib, the SOC of the battery cell is expressed as follows.

$$SOC = SOC0 - \int I(t)dt - \int Ib(t)dt \quad (10)$$

Meanwhile, $\int I$ represents the integrated value of the charge and discharge current I(t), and $\int Ib$ represents the integrated value of the balancing discharge current Ib(t). In addition, (t) represents fluctuation depending on the time. Since I(t) is the charge and discharge current, I(t) is a negative value when the battery system is charged, and the SOC increases. As described above, the balancing discharge current fluctuates somewhat in response to a change in the inter-terminal voltage of each battery cell. Meanwhile, when the SOCs of all the battery cells are obtained, the balancing discharge is performed on the battery cell having variation ΔSOC (0) of the SOCs larger than a predetermined threshold ΔSOCth (>0). The SOC of each battery cell is managed by the battery controller 500 and the cell controller 200.

According to an embodiment of the electrical storage device to which a battery control device including the battery monitoring device of the present invention is mounted, the balancing discharge current Ib for correcting a variation in the SOC of each battery cell is obtained accurately as mentioned above, and thus the variation can be solved in a short time. That is, in principle, the balancing discharge refers to discharge performed by turning on the balancing switch 222 until the following expression is established.

$$\Delta SOC - \int Ib(t)dt = 0 \quad (11)$$

Actually, the balancing discharge is rapidly stopped in a point of time at which, for example, the following expression is established.

$$\Delta SOC - \int Ib(t)dt \leq \Delta SOCth \quad (12)$$

Herein, as described above, when Ib(t) is assumed to be a constant current value Ib calculated using the on-resistance of the balancing switch 222 calculated in the above-mentioned desired method, the approximate balancing discharge time t can be obtained in, for example, the following expression.

$$\Delta SOC - Ib \cdot t = 0 \quad (13)$$

In the actual balancing discharge, since various methods are considered including the setting of ΔSOCth, a method described below shows only an outline as an example.

(Restriction of Total Power Consumption of Balancing Switch)

Expression (1) is an expression including only the power consumption of one battery cell for the purpose of description, but the actual cell controller IC 300 is provided with a plurality of balancing switches 222. In the above-described embodiment, one cell group is constituted by twelve battery cells, and the cell controller IC 300 that controls one cell group is provided with twelve balancing switches 222 corresponding thereto. Further, the battery system is constituted by a plurality of cell groups, and the cell controller ICs 300 that control these cell groups also operate simultaneously.

The cell controller 200 and the battery controller 500 are provided on one substrate which is not shown in FIGS. 1 and 2, and are stored in a case made of metal. In addition, the balancing resistor 201 is also provided on the substrate.

The balancing switches 222 and the balancing resistors 201 corresponding to the number of battery cells are stored in one metal case, and generate heat when the balancing switches 222 are turned on in the balancing discharge. A plurality of balancing switches 222 may operate simultaneously as described below.

The ambient temperature of the cell controller IC 300 mentioned above is measured for each cell controller IC 300 in the vicinity thereof. In the following description, for the purpose of simplification, the control of the balancing switches 222 in one cell controller IC will be described.

One cell controller is provided with n balancing switches. Correspondingly, $P_{Bs}$ of Expression (1) is replaced by $\Sigma_{i=1,n} P_{BS}(i)$ and the following expression is obtained.

$$T_j = T_a + \Theta_{ja} \cdot (P_0 + \Sigma_{i=1,n} P_{BS}(i)) \quad (14)$$

As described above, the control of the junction temperature being set to be in a range of minimum temperature 0° C. to maximum temperature 40° C. means that since the temperature is in a range of 0° C.≤$T_j$≤40° C., $\Sigma_{i=1,n}P_{BS}(i)$ is controlled so that the following expression is established.

$$0° C. \leq T_a + \Theta_{ja} \cdot (P_0 + \Sigma_{i=1,n}P_{BS}(i)) \leq 40° C. \quad (15)$$

That is, when the balancing switch 222 of the i-th battery cell is turned off, the relation of $P_{BS}(i)=0$ is established, and thus the turn-on and turn-off of the n balancing switches 222 are controlled.

When the relation of $T_a + \Theta_{ja} \cdot (P_0 + \Sigma_{i=1,n}P_{BS}) < 0$ is satisfied from Expression (15) in a case where the battery monitoring device including the cell controller IC 300 has a relation of $T_a \leq 0°$ C. during the start-up of a vehicle, the junction temperature is not set to be equal to or higher than 0° C. even though how much the balancing current is passed. However, actually; even in a case of $T_a < 0°$ C., the junction temperature rises immediately just by the heat generation of the cell controller IC 300, and the following expression is established.

$$T_j = T_a + \Theta_{ja} \cdot P_0$$

When the relation of $T_{amin} = -\Theta_{ja} \cdot P_0$ is established, the inter-terminal voltage of the battery cell can be measured with a high degree of accuracy in a case of $T_{amin} \leq T_a$. Therefore, in a case of $T_a < T_{amin}$, when the balancing current is passed, for example, to some extent, and $T_a$ is in a state where the condition of the inequality sign of the left side in Expression (15) is satisfied, high-accuracy voltage measurement can be performed in the measurement of the inter-terminal voltage of the battery cell. Alternatively, the cell controller IC can also be warmed up using a heater (not shown) or the like which is separately provided.

It is important to control the turn-on and turn-off of n balancing switches so as to satisfy the following expression, from the condition of the inequality sign of the right side in Expression (15).

$$\Sigma_{i=1,n}P_{BS}(i) \leq (40° C. - T_a)/\Theta_{ja} - P_0 \quad (16)$$

Meanwhile, when the relation of $T_a \geq 40°$ C. is already satisfied during the start-up of an electromotive vehicle, an additional cooler is required in order to set the junction temperature to be equal to or lower 40° C.

Here, in such a case, a description will be, given on the assumption that the inter-terminal voltage measurement of the battery cell for the control or operation requiring a high-accuracy voltage value of the battery cell is not performed in the battery monitoring device.

Even when the ambient temperature is high temperature or low temperature inappropriate to the high-accuracy voltage measurement, the high-accuracy voltage measurement is not required in, for example, the disconnection diagnosis, and thus the measurement of the inter-terminal voltage in the voltage measurement circuit is appropriately performed. In addition, in the balancing discharge, even when the balancing switch 222 is set to be equal to or higher than 40° C., the temperature coefficient of the on-resistance of a MOSFET switch is positive, and thus the balancing current tends to be reduced. Therefore, since much-than-predicted discharge is not performed due to the balancing discharge, over-discharge does not occur, and the balancing discharge is also appropriately performed.

(Power Consumption Control in Balancing Discharge and Control of Ambient Temperature $T_a$ of Cell Controller IC 300)

The balancing discharge is performed by controlling the turn-on and turn-off of a plurality of balancing switches 222 so as to satisfy the condition of Expression (16).

$P_0$ is power consumption of the operation of the cell controller IC 300 irrelevant to the balancing discharge, and thus is substantially constant. Therefore, when the ambient temperature $T_a$ of the cell controller IC 300 in which the right side of Expression (16) satisfies the relation of $(40° C. - T_a)/\Theta_{ja} - P_0 = 0$ is set to $T_{amax}$, the balancing discharge current has to be set to 0 in the temperature $T_{amax}$ satisfying the following expression, in a case of performing control according to Expression (12).

$$T_{amax} = 40° C. - P_0 \cdot \Theta_{ja} \quad (17)$$

That is, in a case where the ambient temperature of the cell controller IC 300 satisfies the relation of $T_a \geq T_{amax}$, all the balancing switches 222 have to be turned off. However, as previously described, this means that the high-accuracy inter-terminal voltage measurement cannot be performed, and does not mean that the balancing discharge is not performed at all.

When the ambient temperature of the cell controller IC 300 is less than a temperature which is set in Expression (17), that is, when the relation of $T_a < T_{amax}$ established, the junction temperature can be controlled to 40° C. or lower by appropriately turning on and turning off the plurality of balancing switches 222.

When the balancing discharge is performed, the ambient temperature $T_a$ of the cell controller IC 300 rises due to power consumption (on-resistance of balancing resistor and balancing switch) caused by the balancing discharge. Such a rise in temperature is dependent on the temperature of a place of which the ambient temperature is measured, the temperature of the outside thereof, for example, the battery monitoring device, and thermal resistance therebetween.

Regarding a change in temperature inside the battery monitoring device, when a place of which the temperature does not change outside such a battery monitoring device, or a portion having a large heat capacity in the vicinity of the measurement place of the ambient temperature $T_a$ of the cell controller IC 300 is present, it is possible to calculate a rise in the ambient temperature $T_a$ corresponding to the power consumption of the balancing discharge, that is, corresponding to power consumption corresponding to the number of balancing switches 222 turned on, on the basis of the temperature of such a place.

In the start-up of the electromotive vehicle at least after the lapse of a certain amount of time from the previous driving stop of the electromotive vehicle, the ambient temperature $T_a$ of the cell controller IC 300 is considered to be substantially the same as the external temperature of the battery monitoring device or the atmosphere temperature. Therefore, when the ambient temperature $T_a$ of the cell controller IC 300 during vehicle start-up is used as a reference, for example, when one balancing switch 222 is turned on, it can be previously determined whether the ambient temperature $T_a$ of the cell controller IC 300 reaches $T_{amax}$, under the influence of power consumption in the balancing discharge caused by the one balancing switch 222.

A rise in the ambient temperature $T_a$ of the cell controller IC 300 dependent on power consumption at the time of performing the balancing discharge may be experimentally measured in advance to form a table, and the table may be stored in, for example, the storage unit 505 of the battery controller 500. Alternatively, data on a rise in the ambient temperature $T_a$ of the cell controller IC 300 may be calculated through computer simulation.

(Control of Power Consumption Based on Control of Balancing Switch 222)

There are two methods basically in methods of controlling power consumption in the balancing discharge by the turn-on and turn-off of the balancing switch.

One method is to control the duty ratio of the turn-on and turn-off of the balancing switch 222. That is, the method is to control the time at which the balancing switch is turned on between 0% and 100%, and change an average balancing current between 0% and 100%. A MOSFET switch, for example, is used in the balancing switch 222, and PWM control may be performed on a gate of the MOSFET switch.

Such a method is to just turn on one balancing switch 222 at all times, and can also be applied to a case of $T_a \geq T_{amax}$.

Another method is a method of not turning on simultaneously all the balancing switches targeted for the balancing discharge when a plurality of battery cells are targeted for the balancing discharge, that is, when the deviation $\Delta SOC$ of the SOCs of the plurality of battery cells is larger than a predetermined threshold $\Delta SOCth$ requiring the balancing discharge. For example, by changing the balancing switch to be turned on for each constant period of time, it is possible to control power consumption caused by the balancing discharge so as to satisfy the condition of $T_a < T_{amax}$.

Meanwhile, a method of performing the balancing discharge by appropriately selecting the balancing switch to be turned on in this manner falls within the category of the duty control in a broad sense.

FIG. 16 is a diagram schematically illustrating a rise in junction temperature when duty control is performed on all (herein, twelve) the balancing switches within the cell controller IC 300 in an average manner, that is, chip temperature. Since the chip temperature rises due to heat generation in the on-resistance of the balancing switch, the drawing shows a rise in temperature due to only the power consumption of $\Sigma_{i=1,n} P_{BS}$) in the above Expression (14). Since the on-resistance of the balancing switch and the heat capacity of the chip are different depending on the specification of the cell controller IC 300, FIG. 16 simply shows an example of a relationship between the duty ratio of the turn-on and turn-off of the balancing switch and a rise in chip temperature.

In the example shown in FIG. 16, for example, in Expression (14), it is known that when the power consumption $P_0$ of the cell controller IC 300 except for the balancing discharge, is ignored and the ambient temperature $T_a$ is 25° C., the average duty ratio of all the balancing switches is approximately 40% and the chip temperature is 40° C. That is, in this case, the average duty ratio of all the balancing switches is required to be set to be approximately equal to or less than 40%.

Meanwhile, this is an average duty ratio corresponding to power consumption for a short time when the ambient temperature $T_a$ is 25° C. Since the continuation of this state causes the ambient temperature $T_a$ to rise, the average duty ratio is required to be lowered correspondingly.

In consideration of various conditions in the balancing discharge as described above, when a plurality of balancing switches are selected and turned on, and the balancing discharge of the battery cells corresponding to the balancing switches is performed, processes are performed according to the following rules.

1) When the relation of $T_a \geq T_{amax}$ is established in a state where the balancing discharge is not performed, the high-accuracy voltage measurement of the battery cell is not performed.

2) When the relation of $T_a < T_{amax}$ is established in a state where the balancing discharge is not performed, it is possible to perform the high-accuracy voltage measurement of the battery cell, and to simultaneously perform the balancing discharge in the following procedure.

3) The balancing discharge is preferentially performed on the battery cell having the highest SOC.

4) When a plurality of battery cells having the same level the SOC are present, the balancing discharge is simultaneously performed on the battery cells.

5) The following processes are performed so that the sum $(=\Sigma_{i=1,n} P_{BS}(i))$ of power consumption caused by the balancing discharge of the battery cells, including a case of one battery cell, satisfies Expression (16).

a) The duty ratio of the balancing discharge is changed.

b) The battery cell on which the balancing discharge is performed is switched.

The turn-on and turn-off of the balancing switch is performed by changing, the content of the balancing switch control register 247 for each predetermined control cycle of the cell controller IC 300, all the operations of the above-mentioned 3), 4), and 5) are also controlled by the content of the balancing switch control register 247.

FIG. 17 is a diagram illustrating the outline of a flow when a balancing discharge operation using the battery system monitoring device according to the present invention is performed on the secondary battery of type B described in FIGS. 13 and 14. Meanwhile, FIG. 17 is a diagram in which a description is given with an emphasis on processes in the microcomputer 504, and only portions related to the present invention are extracted and are illustrated collectively. For example, each cell controller IC is first started up during electromotive vehicle start-up (step S1), but the start-up sequence is omitted. In addition, the diagnoses of internal circuit operations of each battery cell and the cell controller IC itself, the disconnection diagnoses of the voltage detection lines, or the like is not included in this flow. The inverter 700 is not connected to the electrical storage device 100 during the start-up of a vehicle, and the relays 600 and 610 are in an open state. The connection between the inverter 700 and the electrical storage device 100 is performed in the course of the flow of FIG. 17, but is not shown in the drawing.

The measurement of the inter-terminal voltage of each battery cell is also used in the real-time calculation (the description thereof will be omitted) of, for example, the internal resistance (DCR) of each battery cell, or the like, in addition to these various diagnoses. Therefore, the measurement of the inter-terminal voltage of each battery cell is performed appropriately in a predetermined cycle, and the measurement of the ambient temperature $T_a$ is also performed as a portion of the measurement of the inter-terminal voltage of each battery cell. As shown in FIG. 5, the inter-terminal voltage of each battery cell and the output voltage of the temperature detection circuit are selected by the switching of the multiplexer 210. These voltages are used collectively as data packets, and are transmitted to each cell controller IC 300 through the communication path described in FIGS. 3 and 4.

After the electromotive vehicle is started up in step S1, the microcomputer 504 generates a command for measuring the ambient temperature of each cell controller IC in step S2.

The command is transmitted to each cell controller IC 300 through the communication path described in FIGS. 3 and 4.

The cell controller IC 300 selects an output of the temperature detection circuit in the multiplexer 210 in a state where the balancing switch 222 is turned off, and inputs the voltage to the differential amplifier 211. The output voltage from the temperature detection circuit is digitized in the AD converter 212 and input to the logic unit 213. The logic unit 213 further transmits the digitized output voltage of the temperature detection circuit to the microcomputer 504 through the communication path.

The microcomputer 504 calculates the ambient temperature Ta of the cell controller IC 300, using data, stored in the storage unit 505, for converting the output voltage of the temperature detection circuit into a temperature (step S3).

In step S4, when the ambient temperature Ta of the cell controller IC 300 does not fall within a range between a predetermined lower limit temperature $T_{amin}$ and an upper limit temperature $T_{amax}$ the OCV measurement is not performed, and thus steps S5 to S12 are skipped and the processing operation of step S13 is performed. In this case, since the previous balancing discharge is continuously performed, the balancing discharge is performed on the battery cell having the previous balancing discharge unfinished therein. That is, a list of the battery cells targeted for the balancing discharge and a balancing discharge schedule of these battery cells, which are described below, successively use previous contents.

When the relation of $T_{amin}<T_a<T_{amax}$ is established, the process proceeds to step S5, and the microcomputer 504 generates a command for performing the OCV measurement of each battery cell.

The cell controller IC 300 measures the inter-terminal voltage, of each battery cell in step S5C1, and transmits measurement results to the microcomputer 504.

Meanwhile, since the measurement of the inter-terminal voltage in this case is performed during the start-up of the electromotive vehicle, the electrical storage device 100 is not yet connected to the inverter 700, and thus the measured inter-terminal voltage is set to an open-circuit voltage (OCV).

In step S6, even in a case where one measured OCV of the battery cell is present, the process proceeds to step S7 when the OCV falls within the region B described in FIG. 14.

In step S7, as described with reference to FIG. 14, it is determined whether a predetermined time elapses from a point of time at which the SOC is calculated by measuring the previous OCV. When it is determined that a predetermined time elapses from a point of time at which the SOC is calculated by measuring the previous OCV, the processing operations of steps S8 to S13 are performed even in a case where the measured OCV of the battery cell located at the region B of FIG. 14. In this case, data of the previous OCV measurement stored in the storage unit 505 of the battery controller 500 is used.

Meanwhile, the predetermined time is determined depending on the specification and the state of use of the secondary battery, but the details thereof will not be given.

When it is determined in step S7 that a predetermined time does not elapse from a point of time at which the SOC is calculated by measuring the previous OCV, the SOC calculation is not performed, the following steps S8 to S13 are skipped and the processing operation of step S14 is performed. In this case, similarly, the balancing discharge is performed on the basis of data of the previous balancing discharge.

With such an operation, is possible to perform the balancing discharge of the secondary battery on the basis of the most accurate SOC according to the state of the secondary battery.

When it is determined in step S6 that the OCV of each battery cell falls within the region A of FIG. 14, or when it is determined in step S7 that a predetermined time elapses from the previous OCV measurement, the SOC of each battery cell is calculated in step S8. As mentioned above, the calculation of the SOC is performed using the OCV-SOC conversion curves described in FIGS. 13 and 14.

In step S9, the deviation ΔSOC of the SOC is calculated with respect to each battery cell, from the SOC of each battery cell calculated in step S8. In addition, in this case, the order of the size of the SOC is also calculated.

In step S10, it is determined whether the battery cell targeted for the balancing discharge is present. The balancing discharge is performed on the battery cell having the deviation ΔSOC of the SOC larger than a predetermined, threshold ΔSOCth. When the battery cell having the SOC of deviation larger than ΔSOCth is not present, the process is terminated in step S19.

When the battery cell targeted for the balancing discharge is present, a list of the battery cells targeted for balancing is created in step S11. Further, in step S12, each target total balancing discharge current amount ($\int Ib(t)dt$ of Expressions (10) to (12), or Ib·t of Expression (13)) is calculated in the battery cell targeted for the balancing discharge. For example, the target total balancing discharge current amount is calculated using Expression (10), the deviation ΔSOC of the SOC is set to the target total balancing discharge current amount. Alternatively, for example, ΔSOC−ΔSOCth may be set to the target total balancing discharge current amount. The setting of ΔSOCth and the target total balancing discharge current amount can be performed variously, and the description thereof will not be given herein.

In step S13, a balancing discharge schedule of the battery cell targeted for the balancing discharge is set. The scheduling of the balancing discharge is performed according to the rules in the balancing discharge mentioned above.

FIG. 18(a) is an example illustrating initial states (SOC values during the start-up of a vehicle) of the SOC of the cell group constituted by twelve battery cells (cell 1 to cell 12) The SOC is generally represented by %. When the values of levels L0 to L4 of, the SOC in FIG. 18(a) fall within the region A of FIG. 14, the SOC is calculated in the above-mentioned step S8 during the start-up of the electromotive vehicle. In addition, the values fall within the region B of FIG. 14, steps S8 to S13 are skipped as mentioned above, and the balancing discharge in step S14 and the subsequent steps is performed using the value of the SOC and the balancing discharge schedule during the previous vehicle stop.

Meanwhile, when the battery system 104 is connected to the inverter 700, the level L0 of the SOC fluctuates depending on the charge and discharge current of the battery system 104. However, herein, attention is focused on only ΔSOC in FIG. 18, and thus the change of L0 is ignored.

The scheduling of the balancing discharge is to determine in what order the balancing discharge is performed on the battery cell selected in step S11. Hereinafter, the scheduling will be described together with the flow of the entire balancing discharge.

Generally, the deviation of the measured values having variation is defined as a difference from the average value of these measured values. However, in a case of the balancing discharge, the above deviation is set to deviation ΔSOC of the SOCs based on the lowest SOC value. This is because the balancing discharge is performed from the battery cell having a large SOC in the balancing discharge. That is, herein, the deviation ΔSOC of the SOCs of each battery cell is defined as a difference from the level L0 which is the smallest value of these battery cells.

The balancing discharge is performed on the battery cell having the deviation of the SOCs of each battery cell equal to or more than a predetermined threshold ΔSOCth. Here, ΔSOCth varies depending on the specification of the secondary battery be used, the balancing resistor, and whether the equalization of the SOCs of each battery cell is performed in a certain degree of the balancing discharge time, but the balancing discharge is performed so that, for example, the relation of ΔSOCth=1% is established.

In the balancing discharge, the discharge of each battery cell is performed so that the deviation ΔSOC of the SOCs of each battery cell is set to be equal to or less than ΔSOCth. In FIG. 18(a), the balancing discharge is performed on cell 2, cell 6, cell 8, and cell 11 having the deviation of equal to or more than ΔSOCth, and these cells are in a state as shown in, for example, FIG. 18(b).

Various methods are considered to be applied to such balancing discharge. For example, a method may be used in which the discharge of the battery cell having the SOC of equal to or more than ΔSOCth is performed until ΔSOC is set to be 0, and may be performed until ΔSOC is set to be ΔSOCth/2.

In such balancing discharge, as in the related art, the balancing discharge may be performed simply in order from large ΔSOC of each battery cell.

In the following description, power consumption in the balancing switches when the balancing switches of each battery cell of the cell 1 to the cell 12 are turned on is set to $P_{BS}(i)$; i=1 to 12.

In the example shown in FIG. 18, first, the balancing discharge is initially performed on the cell 2 by turning on the balancing switch 222 until the SOC thereof is changed from the level L4 to the level L3. In this case, when the relation of $P_{BS}(2)>(40°\ C.-T_a)/\Theta_{ja}-P_0$ is established by only the balancing discharge of one battery cell, a duty ratio for turning on the balancing switch 222 of the cell 2 is changed. When the duty ratio is set to D, the balancing switch 222 is controlled so that the following expression is established.

$$P_{BS}(2) \cdot D \leq (40°\ C.-T_a)/\Theta_{ja}-P_0 \quad (18)$$

When the relation of D=50% has to be established, the balancing switch is turned on for each predetermined cycle, for example, at intervals of 1 cycle in the control cycle of the cell controller IC 300.

When the balancing discharge is performed on the cell 2 up to the level D of the SOC, the cell 2, the cell 6, and the cell 11 are set to the level L3 having the same SOC, and thus the balancing, discharge of these cells is performed. There are two methods of performing the balancing discharge of a plurality of battery cells, as stated above. That is, there are a method of performing duty control by simultaneously turning on and turning off three battery cells (cell 2, cell 6, and cell 11), and a method of performing duty control by turning on the balancing switches 222 of three battery cells while performing the switching thereof.

Even in a case where three balancing switches are simultaneously turned on when the cycle of the duty control is sufficiently short, the balancing switches can be controlled so as to satisfy the following Expression (19).

$$(P_{BS}(2)+P_{BS}(6)+P_{BS}(11)) \cdot D \leq (40°\ C.-T_a)/\Theta_{ja}-P_0 \quad (19)$$

Alternatively, when the duty control is performed on three balancing switches while performing the switching thereof, the duty ratios of the balancing switches 222 of the respective battery cells are set to D (2), D (6), and D (11), and the control thereof can be performed as follows.

$$P_{BS}(2) \cdot D(2)+P_{BS}(6) \cdot D(6)+P_{BS}(11) \cdot D(11) \leq (40°\ C.-T_a)/\Theta_{ja}-P \quad (20)$$

However, D (2), D (6), and D (11) are defined so that the three balancing switches are not turned on simultaneously.

The reduction of the SOC due to the balancing discharge of each battery cell when the duty control is performed corresponds to the current amount ($\int Ib(t)dt$ of Expressions (10) to (12) or Ib·t of Expression (13)), and is expressed by $D*\int Ib(t)dt$ or D·Ib·t. However, t is the time at which the balancing discharge is performed including the duty control. In this case, D·t corresponds to the time at which the balancing switch is turned on actually.

When the balancing discharge is performed on three battery cells (cell 2, cell 6, and cell 11) up to the level L2 of the SOC, four battery cells (cell 2, cell 6, cell 8, and cell 11) are set to have the same level L2. Therefore, similarly to the above, the levels of the SOCs of the four battery cells are set to L1 by performing the balancing discharge operation.

All the SOCs of twelve battery cells fall within the range of ΔSOCth through the above-mentioned operation, and thus the balancing discharge operation is terminated.

In the method as described above, the balancing discharge schedule is determined, and the balancing discharge is executed in step S14 and the subsequent steps.

First, in step S14, a balancing discharge command of the battery cell targeted for balancing (considering duty control) is generated, and the balancing switch 222 of the battery cell targeted for balancing is turned on in the cell controller IC 300 on the basis of the command, and the balancing discharge is performed thereon (step S14C1). The control is performed for each predetermined cycle. When turn-on is not specified in each cycle, the balancing switch is turned off and the duty control is performed.

As mentioned above, while the cell controller 200 or each cell controller IC 300 operates, the measurement of the inter-terminal voltage of the battery cell is performed appropriately (substantially in real-time) by the command from the battery controller 500, the balancing current of each battery cell is calculated on the basis of the measured inter-terminal voltage, the integrated value of the balancing discharge currents is calculated, and the SOC of the battery cell is calculated (step S15).

Meanwhile, in this case, as described in the above-mentioned Expression (12), when the calculated SOC of the battery cell is set to a state where the balancing discharge is terminated, a command for stopping the balancing discharge of the battery cell is transmitted from the battery controller 500 to the cell controller IC 300, and the balancing switch corresponding to the battery cell is turned off (step S15C1).

In step S16, whether the battery cell having the balancing discharge unfinished therein is determined from the calculated SOC of each battery cell, for example, using the above-mentioned threshold ΔSOCth and Expression (12). When all the battery cells satisfy Expression (12), the balancing discharge is terminated (step S19).

When the battery cells targeted for the balancing discharge remain, a list of the battery cells targeted for balancing is adjusted so that these battery cells remain in the list (step S17). Subsequently, rescheduling of the balancing discharge is performed in step S18, and the balancing discharge continues to proceed returning to step S14.

In the simple example shown in FIG. 18, when the time required for the balancing discharge is initially calculated for each battery cell, the processes from steps S15 to S18 seem to be unnecessary. However, in reality, the SOC of each battery cell varies more finely than that shown in FIG. 18. In addition, since the balancing discharge currents of the respective battery cells are also different from each other depending on the on-resistance of the balancing switch or the internal state of each battery cell, it is necessary to appropriately measure the inter-terminal voltage of the battery cell in predetermined cycle, to further calculate the balancing discharge currents and the SOC on the basis of the inter-terminal voltage, and to perform control while referring to the ambient temperature of the cell controller IC.

In addition, the calculation and control of the SOC in a predetermined cycle are required in order to reliably avoid over-discharge of each battery cell for the purpose of the efficient operation of the battery system and the safe operation of a vehicle.

Although not described above, even when the ambient temperature Ta of the cell controller IC 300 does not fall within a predetermined range (0° C. to 40° C.), and the OCV of the battery cell is not located at the region A of FIG. 14, it is also considered that in some cases, the calculation of the SOC by measuring the inter-terminal voltage in such a state may obtain the most accurate SOC in this state. In such a case, even when accuracy is not good, it is necessary to perform the control of the battery system and the control of the vehicle using the SOC calculated in this manner, for the purpose of the safe operation of the vehicle.

For example, although a detailed description is not given, in some cases, it is also possible to calculate the SOC by measuring CCV and internal resistance rather than the OCV of the battery cell, and correcting the temperature of the battery cell or the like from the measurement. The SOC calculated in this manner can also be used in the SOC used in the balancing discharge of steps S14 to S18 in FIG. 17.

(Modification Example of Balancing Discharge)

In the balancing discharge described in the example of FIG. 18, different duty ratios are respectively given to, for example, the cell 2, the cell 6, the cell 8, and the cell 11 from the beginning, and thus it is also possible to control the balancing discharge of four battery cells so as to continuously perform the balancing discharge thereof.

In the example shown in FIG. 18, differences between L1–L2, L2–L3, and L3–L4 are substantially equal to each other. In such case, when the relation of D(2):D(6) and D(11):D (8)=3:2:1 is established in a case where, for example, the balancing discharge currents of four battery cells are substantially equal to, each other, the balancing discharge is not performed while the balancing discharge currents are made constant for each level of the SOC in a stepwise manner as mentioned above, and the balancing discharge of the four battery cells can be performed continuously and with priority given to the battery cell having a large deviation for the SOC.

Herein, relationships between the open-circuit voltage (OCV) and the closed circuit voltage (CCV) of the battery cell and between the polarization voltage Vp, the charge and discharge current I and the internal resistance DCR will be described briefly. These relationships are associated with the following Expression (21).

$$CCV=OCV+I\cdot DCR+Vp \quad (21)$$

In an initial state where a load such as an inverter is not connected to the battery cell 101 or the battery system 104, since the relation of I=0 is established and the relation of Vp=0 is established without causing polarization, the relation of CCV=OCV is established. That is, when the electromotive vehicle is stopped for a predetermined time and then is started up, result obtained by measuring the inter-terminal voltage of the battery cell is the OCV.

When a load such as an inverter is connected, and the state where the charge and discharge current I flows is kept up, polarization is generated inside, the battery cell. The battery cell is required to be left as it is for a predetermined time until the polarization is solved. Therefore, once the polarization is generated, the CCV and the OCV are not consistent with each other even in a case where the charge and discharge current I is set to be 0. For this reason, the measurement of the OCV is performed in a state where the polarization during vehicle start-up is solved.

Since the balancing discharge current is determined by the CCV and the balancing resistance, and the on-resistance of the balancing switch as described above, the CCV is appropriately measured while the vehicle operates. In addition, although a description is not given herein, it is possible to calculate the internal resistance DCR of the battery cell from the time variation due to the inverter load, and to estimate the deterioration state of the battery cell from this. Further, the CCV is measured, and thus it is possible to perform the disconnection detection of the voltage detection line or the like, and various diagnoses of circuits within the battery monitoring device.

Therefore, as described above, in a case of the region B of the OCV-SOC conversion curves of FIG. 14, and in a case where the junction temperature is set not to be in a range of 0° C. to 40° C. as shown in FIG. 15, the high-accuracy voltage measurement for calculating the SOC is not performed, but the inter-terminal voltage measurement of the battery cell for objects other than that is appropriately performed.

In the cell controller IC used in the battery monitoring device according to the present invention, the terminal (CV terminal) for inter-terminal voltage measurement of the battery cell and the terminal (BS terminal) for balancing discharge are separately provided as described in FIG. 5, and inter-terminal voltage measurement and the balancing discharge of the battery cell do not interfere with each other. In addition, the output voltage from the temperature measurement circuit can also be measured simultaneously with the inter-terminal voltage measurement of the battery cell, and in parallel with the balancing discharge. In addition, the inter-terminal voltage measurement of the battery cell and the measurement of the output voltage from the temperature measurement circuit are performed while switching the multiplexer 210, in one control cycle of the cell controller IC 300. Therefore, the voltage measurement and the balancing discharge are performed at almost the same time.

Thereby, it is possible to perform the balancing discharge in response to the time variation of the ambient temperature of the cell controller in real time.

In the example shown in the description the above-mentioned embodiment, a description has been given on the assumption that the battery system 104 is configured such that the cell groups 102 are connected in series to each other. The battery system 104 may be configured such that a plurality of cell groups are connected in series-parallel to or in parallel to each other.

In addition, the above description has been given of the configuration in which the cell controller IC 300 are provided in a one-to-one correspondence with the cell groups 102, but it is also possible to control a plurality of cell groups using one cell controller, and to control one cell group using a plurality of cell controllers. The number of battery cells constituting the cell group is variously modified depending on the specification of the battery module including plurality of cell groups, or the battery system. Therefore, it is also possible to control n cell groups, for example, using m cell controllers. In addition, the specification of such various battery systems is set to conform to power specification required for the electromotive vehicle, such as the HEV and the EV, having the battery system mounted thereto.

Therefore, for example, when one cell controller IC 300 is provided so as to control a plurality of cell groups 102 connected in series to each other, the inter-terminal voltage of the entirety of the plurality of cell groups is input to the block voltage input unit 225, the output of the voltage input unit 225 is selected in the multiplexer 210 and is input to the differential amplifier 211, and thus the voltage measurement is performed. In addition, when a plurality of cell controller ICs 300 controls one cell group, the inter-terminal voltage of the cell group controlled by each of the cell controller ICs 300 is input to the block voltage input unit 225 of each of the cell controller ICs 300, and the voltage measurement is performed.

In the battery system monitoring device according to the present invention, for example, the configurations and functions of the cell controller as described above can also be applied to the battery system having such various configurations. In this manner, the battery system monitoring device according to the present invention can be applied to the battery system having various configurations and the electromotive vehicle having various specifications.

The above description is an example of the embodiments of the present invention, and the present invention is not limited to the embodiments. Those skilled in the art will appreciate that various modifications and changes can be made Without deteriorating the features of the present invention. Therefore, other forms considered to be in the scope of the technical idea of the present invention are also included in the scope of the present invention.

The invention claimed is:

1. A battery system monitoring device comprising:
   a plurality of first control devices that each monitor and control states of a plurality of battery cells in a cell group;
   a second control device that controls the plurality of first control devices;
   wherein each of the plurality of the first control devices include:
      a balancing switch, connected between voltage detection lines connected to a positive electrode of each of the plurality of battery cells in the cell group and voltage detection lines connected to a negative electrode of each of the plurality of battery cells in the cell group,
      a first resistor connected in series with the voltage detection lines,
      a balancing discharge circuit including the balancing switch and a second resistor connected in series to the balancing switch, wherein the balancing discharge circuit is connected between the voltage detection lines connected to the positive electrode of each of the plurality of battery cells and the voltage detection lines connected to the negative electrode,
      a first connection point between the balancing discharge circuit and the voltage detection lines connected to the positive electrode of each of the plurality of battery cells in the cell group and a second connection point between the balancing discharge circuit and the voltage detection lines connected to the negative electrode of each of the plurality of battery cells are provided at the cell group rather than the first resistor,
   a selection circuit that selects a selected battery cell from the plurality of battery cells; and
   a voltage measurement circuit that measures an inter-terminal voltage; and
   wherein the second control device:
      commands each respective first controller from the plurality of first controllers to turn off each respective balancing switch,
      receives from each respective first controller, an ambient temperature (Ta) n measured in a vicinity of the respective controller after the respective balancing switch is turned off,
      calculates a junction temperature for each of the plurality of first controller based on the ambient temperature, and
      controls a duty ratio of the balancing switch corresponding to the selected battery cell to perform the balancing discharge of the selected battery cell so that the junction temperature is less than a predetermined upper limit.

2. The battery system monitoring device according to claim 1, wherein when the measured inter-terminal voltages of the plurality of battery cells do not fall within a predetermined voltage range at all, and a predetermined time elapses from a point of time at which a previous remaining capacity (SOC) is calculated using an open-circuit voltage (OCV),
   the second control device further calculates an SOC of each of the plurality of battery cells, identifies a lowest SOC, determines deviations for each of the plurality of battery cells based on the lowest SOC, and controls one or more of the plurality of first control devices to perform balancing discharge of one or more of the battery cells having SOC deviations equal to or more than a predetermined deviation threshold.

3. The battery system monitoring device according to claim 1, wherein when the measured inter-terminal voltages of the plurality of battery cells do not fall within a predetermined voltage range at all,
   the second control device further controls one or more of the plurality of first control devices to perform balancing discharge of the one or more battery cells targeted for balancing discharge during previous stop of a vehicle in which the battery system monitoring device is installed.

4. The battery system monitoring device according to claim 1, further comprising a current detection unit that detects a charge and discharge current of the battery system,
   wherein when the measured inter-terminal voltages of the plurality of battery cells do not fall within a predetermined voltage range at all,
   the second control device further controls one or more of the plurality of first control devices to perform balancing discharge of the one or more battery cells targeted for balancing discharge during previous stop of a vehicle in which the battery system monitoring device is installed, and
   the second control device further calculates a remaining capacity (SOC) of each of the plurality of battery cells is calculated by integrating the charge and discharge current of the battery system detected by the current detection unit and a current of balancing discharge of each battery cell, to the SOC during previous stop of the vehicle.

5. The battery system monitoring device according to claim 1, wherein the second control device further calculates remaining capacity (SOC) of each of the plurality of battery cells; and controls the balancing discharge circuit of the selected battery cell, with priority given to a battery cell having a large deviation for the SOC.

6. The battery system monitoring device according to claim 4, wherein the second control device performs the balancing discharge of the selected battery cell, with priority given to a battery cell having a large deviation for the SOC.

7. The battery system monitoring device according to claim 1, further comprising:

N (N≥1) cell groups connected in series with each other;

M (M≥1) first control devices that control the N cell groups; and the second control device which is a high-order control device of the M first control devices, a highest-order first control device of the M first control devices and the second control device are connected to each other by communication lines through an insulating element, a lowest-order first control device of the M first control devices and the second control device are connected to each other by the communication lines through the insulating element, the M first control devices are connected to each other through the communication lines, and the M first control devices are controlled by a control signal and control data from the second control device.

8. The battery system monitoring device according to claim 3, wherein the second control device performs the balancing discharge of the one or more battery cells targeted for the balancing discharge, with priority given to a battery cell having a large deviation for the SOC.

9. The battery system monitoring device according to claim 3, wherein the second control device controls a duty of the balancing switch corresponding to the one or more battery cells targeted for the balancing discharge to perform the balancing discharge of the battery cell targeted for the balancing discharge so that the temperature in a vicinity of one or more of the plurality of first control devices is less than the predetermined upper limit.

10. The battery system monitoring device according to claim 1, wherein the balancing switch includes a temperature compensation circuit that can change a resistance of the balancing discharge circuit based on the junction temperature.

11. The battery system monitoring device according to claim 1, wherein the junction temperature (Tj) is further calculated based on a temperature resistance ($\Theta$ja), a power consumption of the first controller when balancing discharge is not performed (P0) and power consumption by the balancing discharge circuit (PBS) according to:

$$T_j = T_a + \Theta_{ja} \cdot (P_0 + P_{BS}).$$

* * * * *